United States Patent
Kamata et al.

(10) Patent No.: US 10,297,326 B2
(45) Date of Patent: May 21, 2019

(54) SENSE AMPLIFIER AND LATCH CIRCUIT FOR A SEMICONDUCTOR MEMORY DEVICE AND METHOD OF OPERATION THEREOF

(71) Applicant: TOSHIBA MEMORY CORPORATION, Tokyo (JP)

(72) Inventors: Yoshihiko Kamata, Yokohama Kanagawa (JP); Yoko Deguchi, Yokohama Kanagawa (JP); Takuyo Kodama, Sagamihara Kanagawa (JP); Tsukasa Kobayashi, Machida Tokyo (JP); Mario Sako, Yokohama Kanagawa (JP); Kosuke Yanagidaira, Fujisawa Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 15 days.

(21) Appl. No.: 15/411,225

(22) Filed: Jan. 20, 2017

(65) Prior Publication Data

US 2017/0365348 A1     Dec. 21, 2017

(30) Foreign Application Priority Data

Jun. 17, 2016 (JP) .................. 2016-120976

(51) Int. Cl.
| | | |
|---|---|---|
| *G11C 16/10* | (2006.01) | |
| *G11C 16/26* | (2006.01) | |
| G11C 16/04 | (2006.01) | |
| G11C 16/32 | (2006.01) | |

(52) U.S. Cl.
CPC .............. *G11C 16/26* (2013.01); *G11C 16/10* (2013.01); *G11C 16/0483* (2013.01); *G11C 16/32* (2013.01)

(58) Field of Classification Search
CPC .. G11C 16/0483; G11C 16/3427; G11C 16/32
See application file for complete search history.

(56) References Cited

U.S. PATENT DOCUMENTS

| | | | |
|---|---|---|---|
| 6,772,356 | B1 | 8/2004 | Qureshi et al. |
| 7,535,282 | B2 | 5/2009 | Kim et al. |
| 7,852,675 | B2 | 12/2010 | Maejima |
| 8,233,323 | B2 | 7/2012 | Hishida et al. |
| 8,372,720 | B2 | 2/2013 | Fukuzumi et al. |

(Continued)

FOREIGN PATENT DOCUMENTS

JP    2014179151 A    9/2014

OTHER PUBLICATIONS

Taiwan Office Action dated Jul. 14, 2017, filed in Taiwan counterpart Application No. 105124481, 10 pages (with translation).

(Continued)

*Primary Examiner* — Mushfique Siddique
(74) *Attorney, Agent, or Firm* — Kim & Stewart LLP

(57) ABSTRACT

A semiconductor memory device includes a memory cell, a bit line connected to the memory cell, and a sense amplifier connected to the memory cell through the bit line. The sense amplifier includes a sense node connected to the bit line, a first capacitive element connected to the sense node, and a static latch circuit connected to the sense node and retains data of the sense node.

18 Claims, 24 Drawing Sheets

(56) References Cited

U.S. PATENT DOCUMENTS

| | | | |
|---|---|---|---|
| 8,514,627 B2 | 8/2013 | Itagaki et al. | |
| 8,559,226 B2 | 10/2013 | Abe et al. | |
| 8,952,426 B2 | 2/2015 | Maejima | |
| 9,036,411 B2 | 5/2015 | Itagaki | |
| 9,053,805 B2 | 6/2015 | Maeda | |
| 9,293,195 B2 | 3/2016 | Mui et al. | |
| 2006/0034140 A1* | 2/2006 | Ogawa | G11C 7/065 365/230.03 |
| 2009/0244978 A1* | 10/2009 | Yoshihara | G11C 7/065 365/185.21 |
| 2011/0284946 A1 | 11/2011 | Kiyotoshi | |
| 2013/0194867 A1* | 8/2013 | Fukuda | G11C 14/0018 365/185.08 |
| 2014/0269093 A1* | 9/2014 | Maejima | G11C 11/5642 365/185.21 |
| 2014/0269094 A1* | 9/2014 | Maeda | G11C 16/26 365/185.21 |
| 2014/0269095 A1* | 9/2014 | Maejima | G11C 16/28 365/185.21 |
| 2014/0286093 A1* | 9/2014 | Abe | G11C 16/0408 365/185.03 |
| 2015/0221391 A1* | 8/2015 | Tseng | G11C 11/5628 365/185.19 |
| 2017/0062062 A1* | 3/2017 | Tanabe | G11C 16/26 |

OTHER PUBLICATIONS

Taiwan Office Action dated Nov. 30, 2017, filed in Taiwan counterpart Application No. 105124481, 7 pages (with translation).

\* cited by examiner

|        | Er | A | B | C | D | E | F | G |
|--------|----|---|---|---|---|---|---|---|
|        |    |   |   |   | Data |   |   |   |
| Upper  | 1  | 1 | 1 | 0 | 0 | 0 | 0 | 1 |
| Middle | 1  | 1 | 0 | 0 | 1 | 1 | 0 | 0 |
| Lower  | 1  | 0 | 0 | 0 | 0 | 1 | 1 | 1 |

SENSE AMPLIFIER AND LATCH CIRCUIT FOR A SEMICONDUCTOR MEMORY DEVICE AND METHOD OF OPERATION THEREOF

CROSS-REFERENCE TO RELATED APPLICATION

This application is based upon and claims the benefit of priority from Japanese Patent Application No. 2016-120976, filed Jun. 17, 2016, the entire contents of which are incorporated herein by reference.

FIELD

Embodiments described herein relate generally to a semiconductor memory device.

BACKGROUND

Generally, a NAND type flash memory is known as a type of the semiconductor memory device.

DETAILED DESCRIPTION

Figure 1:
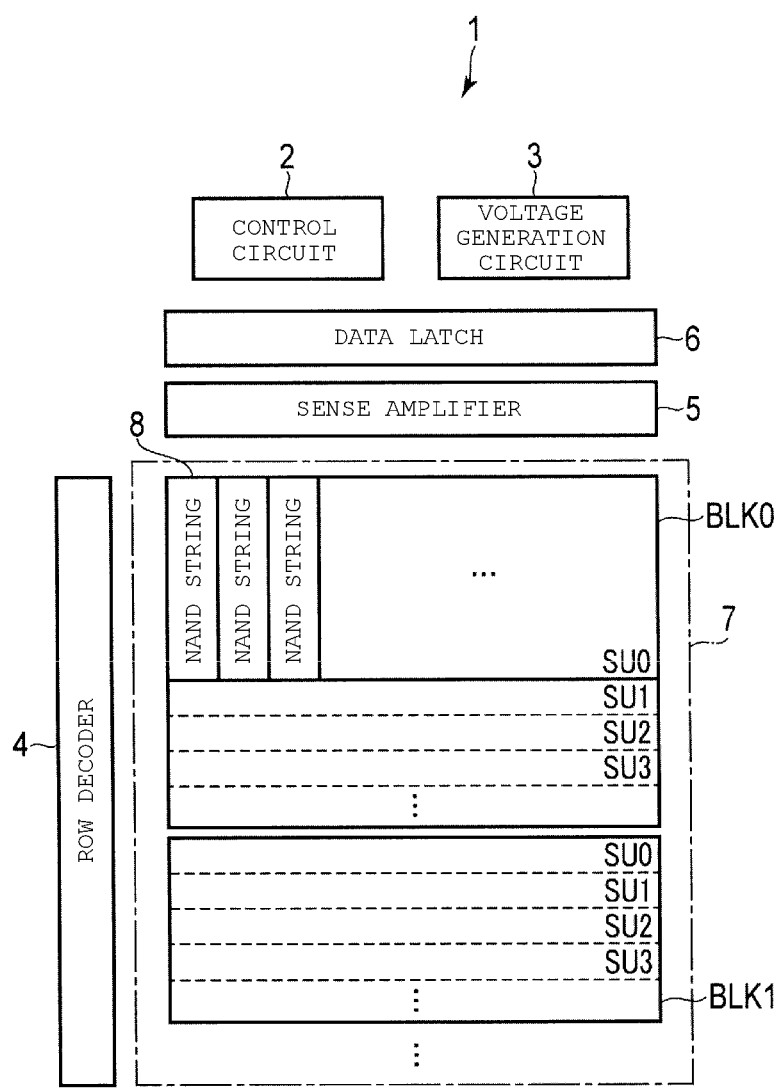
FIG. 1 is a block diagram illustrating a semiconductor memory device according to a first embodiment.

Embodiments provide a semiconductor memory device capable of improving reliability.

In general, according to an embodiment, there is provided a semiconductor memory device including a memory cell, a bit line connected to the memory cell, and a sense amplifier connected to the memory cell through the bit line. The sense amplifier includes a sense node connected to the bit line, a first capacitive element connected to the sense node, and a static latch circuit connected to the sense node and retains data of the sense node.

Hereinafter, exemplary embodiments will be described with reference to the accompanying drawings. In the following description, a common reference numeral will be given to common portions in the drawings.

1. First Embodiment

Description will now be given of a semiconductor memory device according to a first embodiment. Hereinafter, description will be given of a three-dimensional stack type NAND-type flash memory, in which memory cell transistors are three-dimensionally arranged on a semiconductor substrate, as an example of the semiconductor memory device.

1.1 With Respect to Configuration 1.1.1 With Respect to Overall Configuration of Semiconductor Memory Device First, the overall configuration of the semiconductor memory device will be described with reference to FIG. 1. As illustrated in the drawing, a NAND-type flash memory 1 includes a control circuit 2, a voltage generation circuit 3, a row decoder 4, a sense amplifier 5, a data latch 6, and a memory cell array 7.

The memory cell array 7 includes a plurality of blocks BLK (BLK0, BLK1, BLK2, including non-volatile memory cell transistors at intersections of rows and columns. For example, each of the blocks BLK includes four string units SU (SU0 to SU3). In addition, each of the string units SU includes a plurality of NAND strings 8. The number of the blocks in the memory cell array 7, and the number of the string units in each of the blocks are arbitrarily set. Details of the memory cell array 7 will be described later.

The row decoder 4 decodes a row address, and selects any one of the blocks BLK and any one of the string units SU on the basis of the decoding result. In addition, the row decoder 4 outputs a voltage, which is required, to the block BLK. For example, a row address is given from an external controller that controls the NAND-type flash memory 1.

During a data read operation, the sense amplifier 5 senses data that is read from the memory cell array 7. In addition, the sense amplifier 5 outputs the read data to the controller. During a data write operation, the sense amplifier 5 transfers write data, which is received from the external controller, to the memory cell array 7.

During the data read operation, the data latch 6 temporarily retains data that is sensed in the sense amplifier 5, and transfers the retained data to the external controller or a host device through an input and output circuit (not illustrated). In addition, during the data write operation, the data latch 6 temporarily retains write data that is input from the external controller or the host device through the input and output circuit, and transfers the write data to the sense amplifier 5.

The control circuit 2 controls the overall operation of the NAND-type flash memory 1.

The voltage generation circuit 3 generates a voltage, which is required for writing, reading, and erasing of data, in accordance with control of the control circuit 2, and applies the generated voltage to the row decoder 4, the sense amplifier 5, and the like. The row decoder 4 and the sense amplifier 5 apply the voltage supplied from the voltage generation circuit 3, to a memory cell transistor.

1.1.2 With Respect to Configuration of Block BLK

Figure 2:
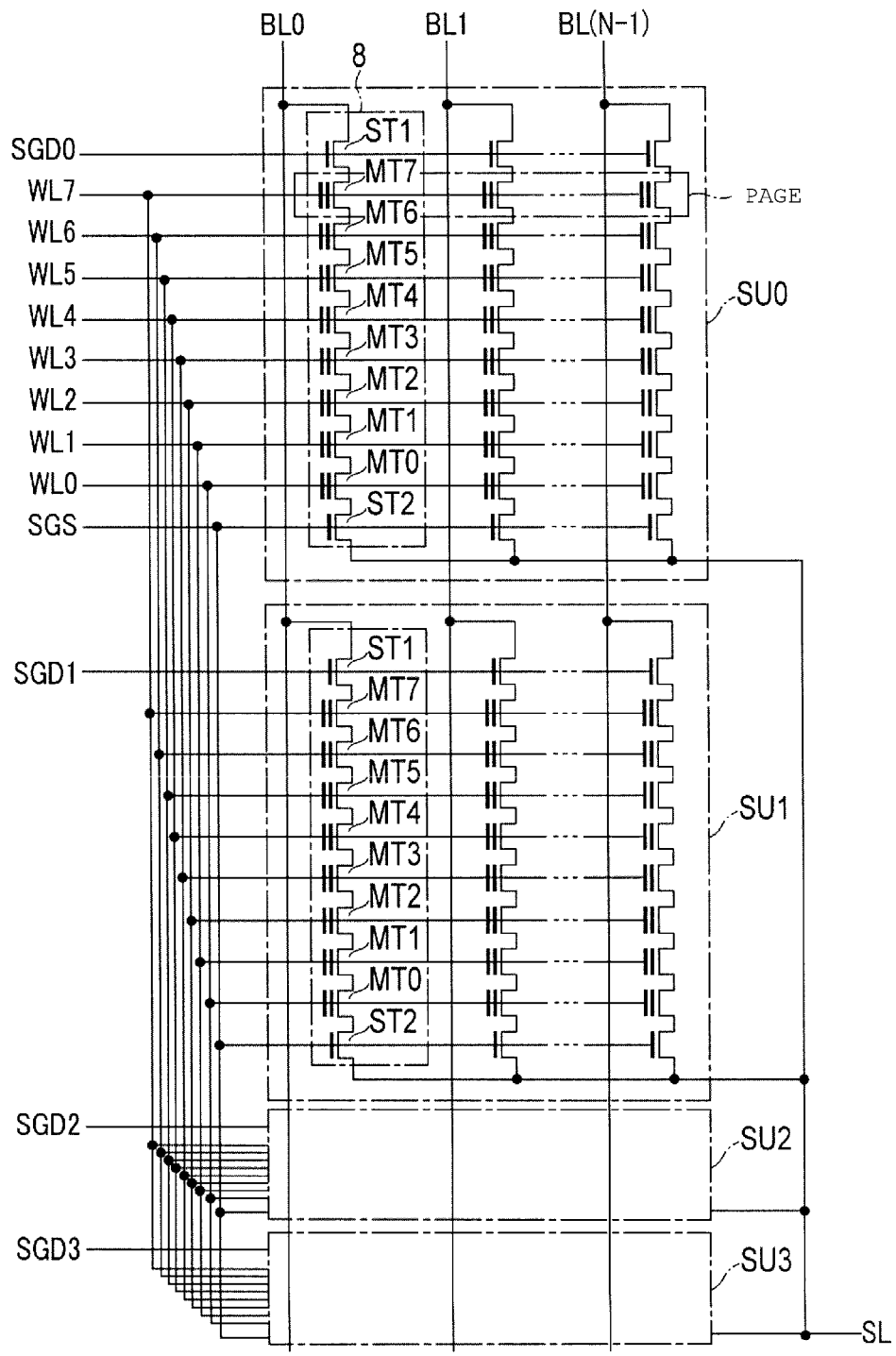
FIG. 2 is a circuit diagram of a memory cell array that is provided in the semiconductor memory device according to the first embodiment.

Next, the configuration of the block BLK will be described with reference to FIG. 2. As described above, for example, the block BLK includes four string units SU, and each of the string units SU includes a plurality of NAND strings 8.

As illustrated in the drawing, for example, each of the NAND strings 8 includes eight memory cell transistors MT (MT0 to MT7), and select transistors ST1 and ST2. Each of the memory cell transistors MT includes a control gate and a charge storage layer, and retains data in a non-volatile manner. In addition, the memory cell transistors MT are connected to each other in series between a source of the select transistor ST1 and a drain of the select transistor ST2.

A gate of the select transistor ST1 in each of the string units SU0 to SU3 is connected to each of select gate lines SGD0 to SGD3. In contrast, for example, gates of the select transistors ST2 in the string units SU0 to SU3 are commonly connected to a select gate line SGS. Of course, in other examples, the gates of the select transistors ST2 may be respectively connected to select gate lines SGS0 to SGS3 different from each other for each string unit SU. In addition, control gates of the memory cell transistors MT0 to MT7 in the same block BLK are commonly connected to word lines WL0 to WL7, respectively.

In addition, drains of the select transistors ST1 of the NAND strings 8 in each of the string units SU are respectively connected to bit lines BL (BL0 to BL(N-1) where N is a natural number of two or greater) which are different from each other. In addition, each of the bit lines BL commonly connects one NAND string 8 in each of the string units SU across the plurality of blocks BLK. In addition, sources of a plurality of the select transistors ST2 are commonly connected to a source line SL.

That is, each of the string units SU is an assembly of the NAND strings 8 which are respectively connected to the bit lines BL different from each other, and are connected to the same select gate line SGD. In addition, each of the blocks BLK is an assembly of a plurality of the string units SU which commonly use the word lines WL. In addition, the memory cell array 7 is an assembly of a plurality of the blocks BLK which commonly use the bit lines BL.

Writing and reading of data are collectively performed with respect to the memory cell transistors MT which are connected to any one of the word lines WL in any one of the blocks BLK. This unit is referred to as "page".

Figure 3:
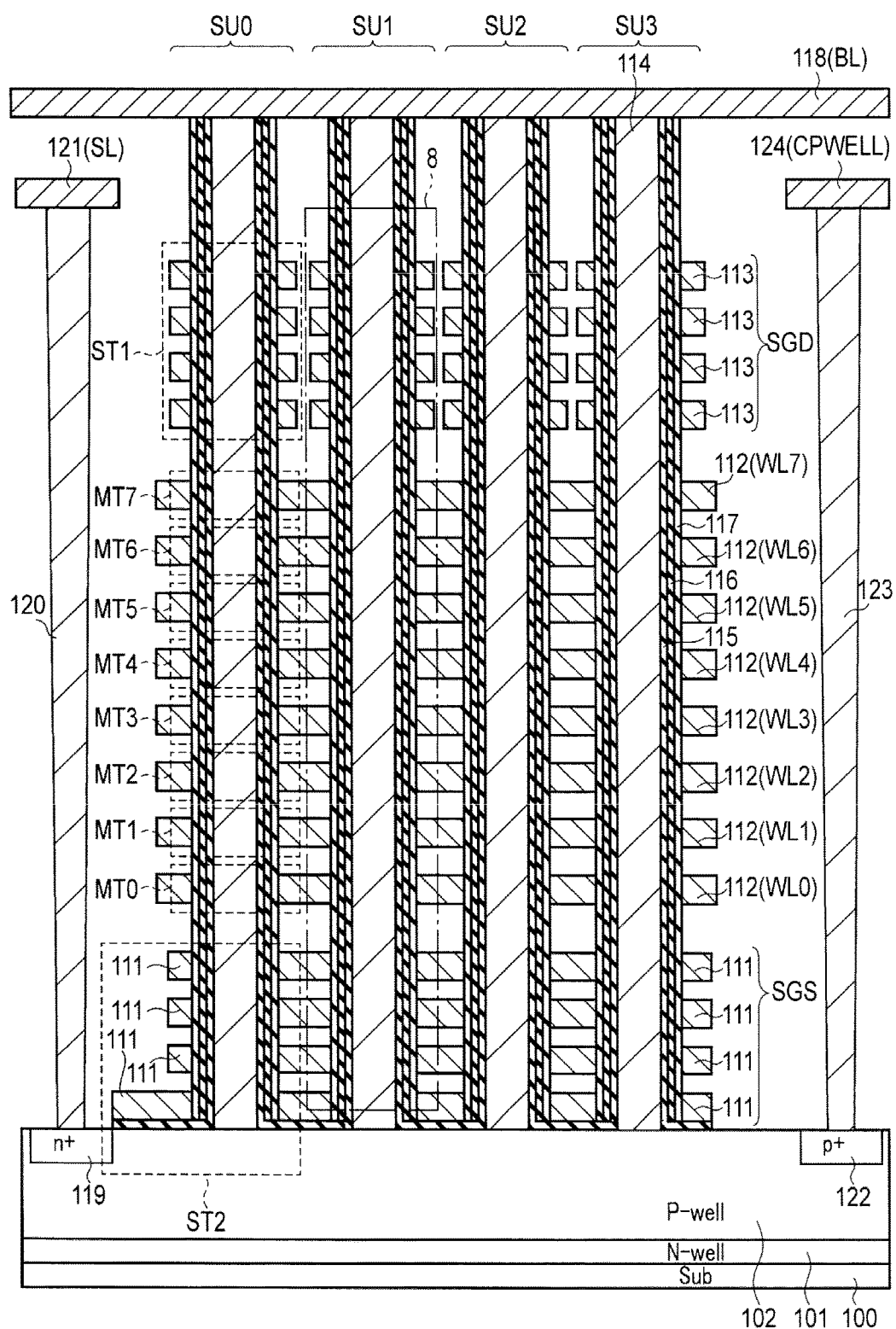
FIG. 3 is a cross-sectional view of the memory cell array that is provided in the semiconductor memory device according to the first embodiment.

FIG. 3 is a cross-sectional view of a partial region of the block BLK. As illustrated in the drawing, an n-type well region 101 is provided in a surface region of a semiconductor substrate 100, and a p-type well region 102 is provided in a surface region of the n-type well region 101. In addition, a plurality of the NAND strings 8 are formed on the p-type well region 102. For example, four wiring layers 111 that function as the select gate line SGS, eight wiring layers 112 that function as the word lines WL0 to WL7, and four wiring layers 113 that function as the select gate line SGD are sequentially stacked on the p-type well region 102. An insulating film (not illustrated) is formed between the wiring layers which are stacked.

In addition, a pillar-shaped conductor 114, containing polysilicon as the conductive material, for example, is formed to penetrate the wiring layers 113, 112, and 111, and to reach the p-type well region 102. A gate insulating film 115, a charge storage layer (an insulating film or a conductive film) 116, and a block insulating film 117 are sequentially formed on a lateral surface of the conductor 114. The gate insulating film 115, the charge storage layer 116, and the block insulating film 117 constitute the memory cell transistor MT and the select transistors ST1 and ST2. The conductor 114 functions as a current path of the NAND string 8, and becomes a region in which channels of the transistors are formed. In addition, an upper end of the conductor 114 is connected to a metal wiring layer 118 that functions as the bit line BL.

An $n^+$-type impurity diffusion layer 119 is formed in the surface region of the p-type well region 102. A contact plug 120 is formed on the diffusion layer 119, and the contact plug 120 is connected to a metal wiring layer 121 that functions as a source line SL. In addition, a $p^+$-type impurity diffusion layer 122 is formed in the surface region of the p-type well region 102. A contact plug 123 is formed on the diffusion layer 122, and the contact plug 123 is connected to a metal wiring layer 124 that functions as a well wiring CPWELL. The well wiring CPWELL is a wiring that applies a potential to the conductor 114 through the p-type well region 102.

A plurality of the above-described configurations are arranged in a depth direction of a paper surface in FIG. 3, and the string unit SU is formed by an assembly of a plurality of the NAND strings 8 which are arranged in the depth direction.

Furthermore, erasing of data can be performed in units of the block BLK, or in units that are smaller than the block BLK. Examples of the erasing method that may be employed are described in U.S. patent application Ser. No. 13/235,389, filed Sep. 18, 2011 with a title of "NONVOLATILE SEMICONDUCTOR MEMORY DEVICE," in U.S. patent application Ser. No. 12/694,690, filed Jan. 27, 2010 with a title of "NON-VOLATILE SEMICONDUCTOR STORAGE DEVICE," and in U.S. patent application Ser. No. 13/483,610, filed May 30, 2012 with a title of "NON-VOLATILE SEMICONDUCTOR MEMORY DEVICE AND DATA ERASE METHOD THEREOF." The entire contents of these patent applications are incorporated herein by reference.

In addition, the memory cell array 7 may have a configuration different from the above-described configuration. Example configurations of the memory cell array 7 that may be employed are described in U.S. patent application Ser. No. 12/407,403, filed Mar. 19, 2009 with a tile of "THREE-DIMENSIONAL STACKED NONVOLATILE SEMICONDUCTOR MEMORY," in U.S. patent application Ser. No. 12/406,524, filed Mar. 18, 2009 with a tile of "THREE DIMENSIONAL STACKED NONVOLATILE SEMICONDUCTOR MEMORY," in U.S. patent application Ser. No. 12/679,991, filed Mar. 25, 2010 with a title of "NON-VOLATILE SEMICONDUCTOR STORAGE DEVICE AND METHOD OF MANUFACTURING THE SAME," and in U.S. patent application Ser. No. 12/532,030, filed Mar. 23, 2009 with a title of "SEMICONDUCTOR MEMORY AND METHOD FOR MANUFACTURING SAME". The entire contents of these patent applications are incorporated herein by reference.

1.1.3 With Respect to Configuration of Sense Amplifier and Data Latch

Figure 4:
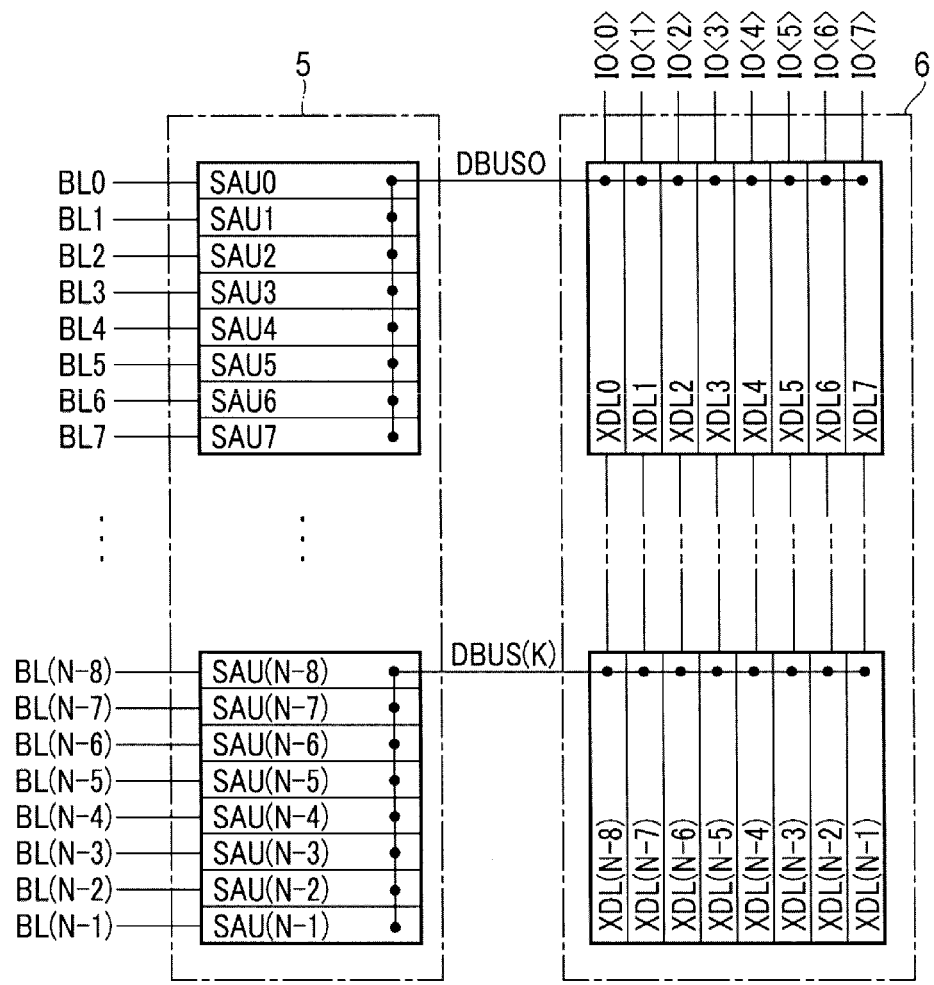
FIG. 4 is a block diagram of a sense amplifier and a data latch which are provided in the semiconductor memory device according to the first embodiment.

Next, description will be given of the configuration of the sense amplifier 5 and the data latch 6 with reference to FIG. 4.

As illustrated in the drawing, the sense amplifier 5 includes a plurality of sense amplifier units SAU (SAU0 to SAU(N-1)). In addition, the data latch 6 includes a plurality of latch circuits XDL (XDL0 to XDL(N-1)).

For example, the sense amplifier units SAU is provided for each of the bit lines BL. For example, eight sense amplifier units SAU are commonly connected to one bus DBUS(K) (K is a natural number of 0 or greater, K<(N-1)). Hereinafter, the bus DBUS(K) is sometimes simply referred to as a bus DBUS. Furthermore, the number of the sense amplifier units SAU, which are connected to the one bus DBUS, is arbitrarily set.

For example, the latch circuit XDL is provided for each of the sense amplifier units SAU, and is connected to one of eight data lines IO<x> (where x is an integer equal to 0 to 7). Furthermore, the number of the data lines IO is arbitrarily set. The latch circuit XDL temporarily retains data related to the bit line BL that corresponds to the latch circuit XDL. More specifically, data, which is received from the external controller, is stored in the latch circuit XDL through the data line IO, and is transferred to the sense amplifier unit SAU, which corresponds to the latch circuit XDL, through the bus DBUS. This is also true in the opposite direction.

Eight sense amplifier units SAU, and eight latch circuits XDL, which respectively correspond to the eight sense amplifier units SAU, are commonly connected to one bus DBUS. More specifically, the eight sense amplifier units SAU0 to SAU7, and the eight latch circuits XDL0 to XDL7, which respectively correspond to the eight sense amplifier units SAU0 to SAU7, are commonly connected to one bus DBUS0. In addition, the latch circuits XDL0 to XDL7 are respectively connected to the data line IO<0> to the data line IO<7>.

1.1.4 With Respect to Configuration of Sense Amplifier Unit

Next, description will be given of a configuration of the sense amplifier unit SAU with reference to FIG. 5. In the following description, one of a source and a drain of a transistor is referred to as "one end of a current path", and the other of the source and the drain is referred to as "the other end of the current path".

Figure 5:
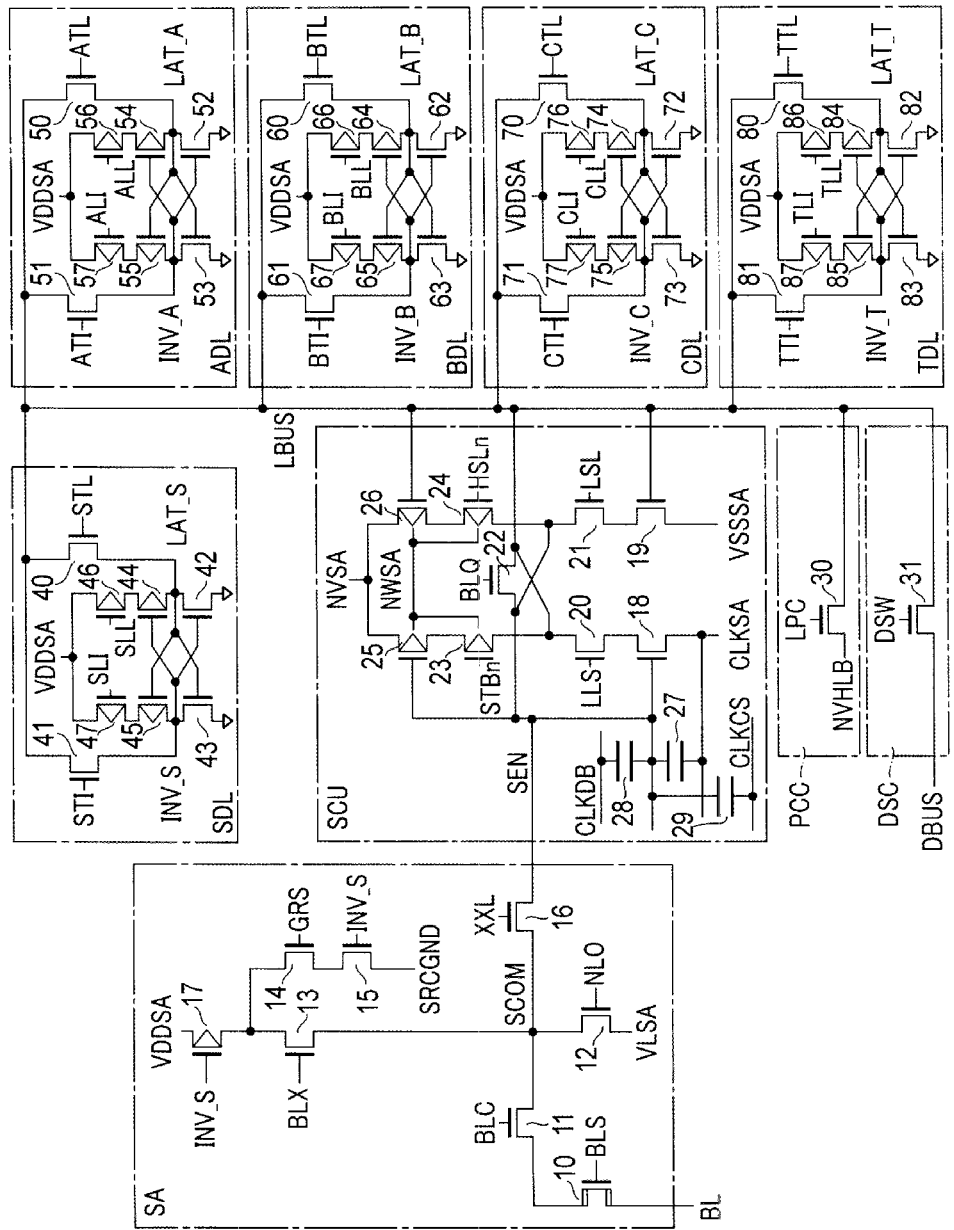
FIG. 5 is a circuit diagram of a sense amplifier unit that is provided in the semiconductor memory device according to the first embodiment.

As illustrated in FIG. 5, the sense amplifier unit SAU includes a sense circuit SA, a scan unit SCU, five latch circuits (SDL, ADL, BDL, CDL, and TDL), an LBUS precharge circuit PCC, and a DBUS switch circuit DSC.

The sense circuit SA applies a voltage to the bit line BL in accordance with program data. That is, the sense circuit SA is a module that directly controls the bit line BL. In addition, during a read operation, the sense circuit SA controls a connection between a node SEN which will be described later and the bit line BL when transferring charges from the node SEN to the bit line BL.

The sense circuit SA includes a high-breakdown-voltage n-channel MOS transistor (also referred to as "NMOS transistor") 10, low-breakdown-voltage n-channel MOS transistors 11 to 16, and a low-breakdown-voltage p-channel MOS transistor (also referred to as "PMOS transistor") 17.

In the transistor 10, a signal BLS is input to a gate, one end of a current path is connected to a corresponding bit line BL, and the other end of the current path is connected to one end of a current path of the transistor 11.

In the transistor 11, a signal BLC is input to a gate, and the other end of a current path is connected to a node SCOM. The transistor 11 functions as a clamp transistor that clamps the corresponding bit line BL to a potential in accordance with the signal BLC.

In the transistor 12, a signal NLO is input to a gate, one end of a current path is connected to the node SCOM, and a voltage VLSA (for example, a ground voltage VSS) is applied to the other end of the current path.

In the transistor 13, a signal BLX is input to a gate, one end of a current path is connected to the node SCOM, and the other end of the current path is connected to one end of a current path of the transistor 14 and one end of a current path of the transistor 17.

In the transistor 14, a signal GRS is input to a gate, and the other end of the current path is connected to one end of a current path of the transistor 15.

In the transistor 15, a gate is connected to a node INV_S, and the other end of the current path is connected to a node SRCGND. For example, the ground voltage VSS is applied to the node SRCGND.

In the transistor 17, a gate is connected to a node INV_S, and a power supply voltage VDDSA is applied to the other end (source) of the current path.

In the transistor 16, a signal XXL is input to a gate, one end of a current path is connected to the node SCOM, and the other end of the current path is connected to the node SEN. The control circuit 2 controls a data sense period (hereinafter, referred to as "sense period") of the memory cell transistor MT by using the transistor 16. The node SEN functions as a sense node that senses data of the memory cell transistor MT that is a target during a data read operation (or during verification). More specifically, charges, which are charged to the node SEN (and capacitive elements 27 to 29), are transferred to the bit line BL in accordance with an on/off state of the memory cell transistor MT that is the target during the read operation. Data is read by sensing a voltage of the node SEN at this time.

The scan unit SCU senses data that is read out to the bit line BL, and converts (hereinafter, referred to as "digitizes") an analog-level voltage signal, which is sensed, to "L"-level or "H"-level logical data (digital signal). The scan unit SCU functions as a latch circuit (hereinafter, referred to as "static latch circuit") that is capable of retaining the "L"-level or "H"-level logical data, and inverted data thereof. Hereinafter, determination of the retention data of the latch circuit to a logical level of any one of the "L" level and the "H" level is referred to as "determination of a logical level" or "determination of logical data". In addition, the scan unit SCU is a module that performs a logical operation by using data that is retained in the latch circuits SDL, ADL, BDL, CDL, and TDL.

The scan unit SCU includes low-breakdown-voltage n-channel MOS transistors 18 to 22, low-breakdown-voltage p-channel MOS transistors 23 to 26, and the capacitive elements 27 to 29.

In the transistor 18, a gate is connected to the node SEN, one end of a current path is connected to a node CLKSA, and the other end of the current path is connected to one end of a current path of the transistor 20.

In the transistor 20, a signal LLS is input to a gate, and the other end of the current path is connected to a bus LBUS.

In the transistor 19, a gate is connected to the bus LBUS, a voltage VSSSA is applied to one end of a current path, and the other end of the current path is connected to one end of a current path of the transistor 21.

In the transistor 21, a signal LSL is input to a gate, and the other end of the current path is connected to the node SEN.

In the transistor 22, a signal BLQ is input to a gate, one end of a current path is connected to the node SEN, and the other end of the current path is connected to the bus LBUS. The transistor 22 enters an on-state when the node SEN and the bus LBUS are electrically connected to each other.

In the transistor 23, a signal STBn is input to a gate, one end of a current path is connected to the bus LBUS, and the other end of the current path is connected to one end (drain) of a current path of the transistor 25. In addition, a back gate of the transistor 23 is connected to a node NWSA.

In the transistor 25, a gate is connected to the node SEN, and the other end (source) of the current path is connected to a node NVSA. For example, a voltage VDDSA is applied to the transistor 25 through the node NVSA. In addition, a back gate of the transistor 25 is connected to the node NWSA. In this embodiment, the transistor 25 functions as a sense transistor that senses a voltage of the node SEN. In addition, during sensing of the node SEN, the control circuit 2 controls a voltage of the node NWSA, and corrects a variation of a threshold voltage of the transistor 25. When the voltage of the node NWSA is controlled, it is possible to allow the threshold voltage of the transistor 25 to vary due to a substrate bias effect. For example, when the voltage of the node NWSA is set to be higher than the voltage VDDSA (a source voltage of the transistor 25), the threshold voltage of the transistor 25 decreases. Furthermore, the transistor 18 may be used as a sense transistor.

In the transistor 24, a signal HSLn is input to a gate, one end of a current path is connected to the node SEN, and the other end of the current path is connected to one end (drain) of a current path of the transistor 26. In addition, a back gate of the transistor 24 is connected to the node NWSA. In this embodiment, when the voltage of the node SEN is higher than the voltage VDDSA, a voltage, which is higher than the voltage of the node SEN, is applied to the node NWSA.

In the transistor 26, a gate is connected to the bus LBUS, and the other end (source) of the current path is connected to the node NVSA.

For example, the capacitive element 27 corresponds to wiring-to-wiring capacitance between the node SEN and the node CLKSA. For example, the capacitive element 28 corresponds to wiring-to-wiring capacitance between the node SEN and node CLKDB. For example, the capacitive element 29 corresponds to parasitic capacitance (hereinafter, referred to as "plug-to-plug capacitance") that occurs between a contact plug that is connected to the node SEN and a contact plug that is connected to the node CLKCS. That is, the capacitive elements 27 to 29 represent parasitic capacitance with respect to the node SEN. Furthermore, the number of the capacitive elements which are connected to the node SEN is not limited to three. In addition, a capacitive element, which includes an upper electrode and a lower electrode differently from each of the nodes or contact plugs, may be provided without using the wiring-to-wiring capacitance or the plug-to-plug capacitance.

In the scan unit SCU, a first inverter is formed by the transistors 18 and 25, and a second inverter is formed by the transistors 19 and 26. In addition, an input of the first inverter and an output of the second inverter are connected to the node SEN, and an output of the first inverter and an input of the second inverter are connected to the bus LBUS. Accordingly, when the transistors 20, 21, 23, and 24 enter an on-state, the scan unit SCU functions as a latch circuit in which inverted data of the data retained by the node SEN is retained by the bus LBUS.

The latch circuits SDL, ADL, BDL, CDL, and TDL temporarily retain data. In a data write operation, the sense amplifier unit SAU controls the bit line BL in accordance with retention data of the latch circuit SDL. For example, the other latch circuits ADL, BDL, CDL, and TDL are used for a multi-value operation in which each of the memory cell transistors retains data of two or more bits. Furthermore, the number of the latch circuits can be arbitrarily set, and is set in accordance with, for example, the amount of data (the number of bits) which is capable of being retained by the memory cell transistor MT.

The latch circuit SDL includes low-breakdown-voltage n-channel MOS transistors 40 to 43, and low-breakdown-voltage p-channel MOS transistors 44 to 47.

In the transistor 40, a signal STL is input to a gate, one end of a current path is connected to the bus LBUS, and the other end of the current path is connected to a node LAT_S.

In the transistor 41, a signal STI is input to a gate, one end of a current path is connected to the bus LBUS, and the other end of the current path is connected to a node INV_S.

In the transistor 42, a gate is connected to the node INV_S, one end (source) of a current path is grounded, and the other end (drain) of the current path is connected to the node LAT_S.

In the transistor 43, a gate is connected to the node LAT_S, one end (source) of a current path is grounded, and the other end (drain) of the current path is connected to the node INV_S.

In the transistor 44, a gate is connected to the node INV_S, and one end of a current path is connected to the node LAT_S.

In the transistor 45, a gate is connected to the node LAT_S, and one end of a current path is connected to the node INV_S.

In the transistor 46, a signal SLL is input to a gate, one end (drain) of a current path is connected to the other end of the current path of the transistor 44, and the power supply voltage VDDSA is applied to the other end (source) of the current path.

In the transistor 47, a signal SLI is input to a gate, one end (drain) of a current path is connected to the other end of the current path of the transistor 45, and the power supply voltage VDDSA is applied to the other end (source) of the current path.

In the latch circuit SDL, a first inverter is formed by the transistors 42 and 44, and a second inverter is formed by the transistors 43 and 45. In addition, an output of the first inverter and an input (node LAT_S) of the second inverter are connected to the bus LBUS through the transistor 40 for data transmission, and an input of the first inverter and an output (node INV_S) of the second inverter are connected to the bus LBUS through the transistor 41 for data transmission. In the latch circuit SDL, data is retained by the node LAT_S, and inverted data of the data is retained by the node INV_S. That is, the latch circuit SDL is a static latch circuit.

The latch circuits ADL, BDL, CDL, and TDL have the same configuration as that of the latch circuit SDL, and the detailed description thereof will be omitted. However, reference numerals and signal names of respective transistors will be described below differently from those of the latch circuit SDL as illustrated in FIG. 5. The transistors 40 to 47 of the latch circuit SDL correspond to transistors 50 to 57 of the latch circuit ADL, transistors 60 to 67 of the latch circuits BDL, transistors 70 to 77 of the latch circuit CDL, and transistors 80 to 87 of the latch circuit TDL, respectively. In addition, in respective sense amplifier units SAU, the sense circuit SA, the scan unit SCU, and the five latch circuits SDL, ADL, BDL, CDL, and TDL are connected to each other by the bus LBUS in a manner capable of transmitting and receiving data to and from each other.

The LBUS precharge circuit PCC precharges the bus LBUS. For example, the LBUS precharge circuit PCC includes a low-breakdown-voltage n-channel MOS transistor 30. In the transistor 30, a signal LPC is input to a gate, one end of a current path is connected to the bus LBUS, and the other end of the current path is connected to a node NVHLB. For example, the voltage VDDSA or the voltage VSS is applied to the transistor 30 through the node NVHLB.

The DBUS switch circuit DSC connects the bus LBUS and the bus DBUS. For example, the DBUS switch circuit DSC includes a low-breakdown-voltage n-channel MOS transistor 31. In the transistor 31, a signal DSW is input to a gate, one end of a current path is connected to the bus LBUS, and the other end of the current path is connected to the bus DBUS.

Furthermore, various kinds of signals in the sense amplifier unit SAU configured as described above is applied from, for example, the control circuit 2.

1.1.4 With Respect to Configuration of Capacitive Element

Next, the configuration of the capacitive elements 27 to 29 will be described in detail with reference to FIG. 6 to FIG. 9. An insulating film is omitted in FIG. 6.

Figure 6:
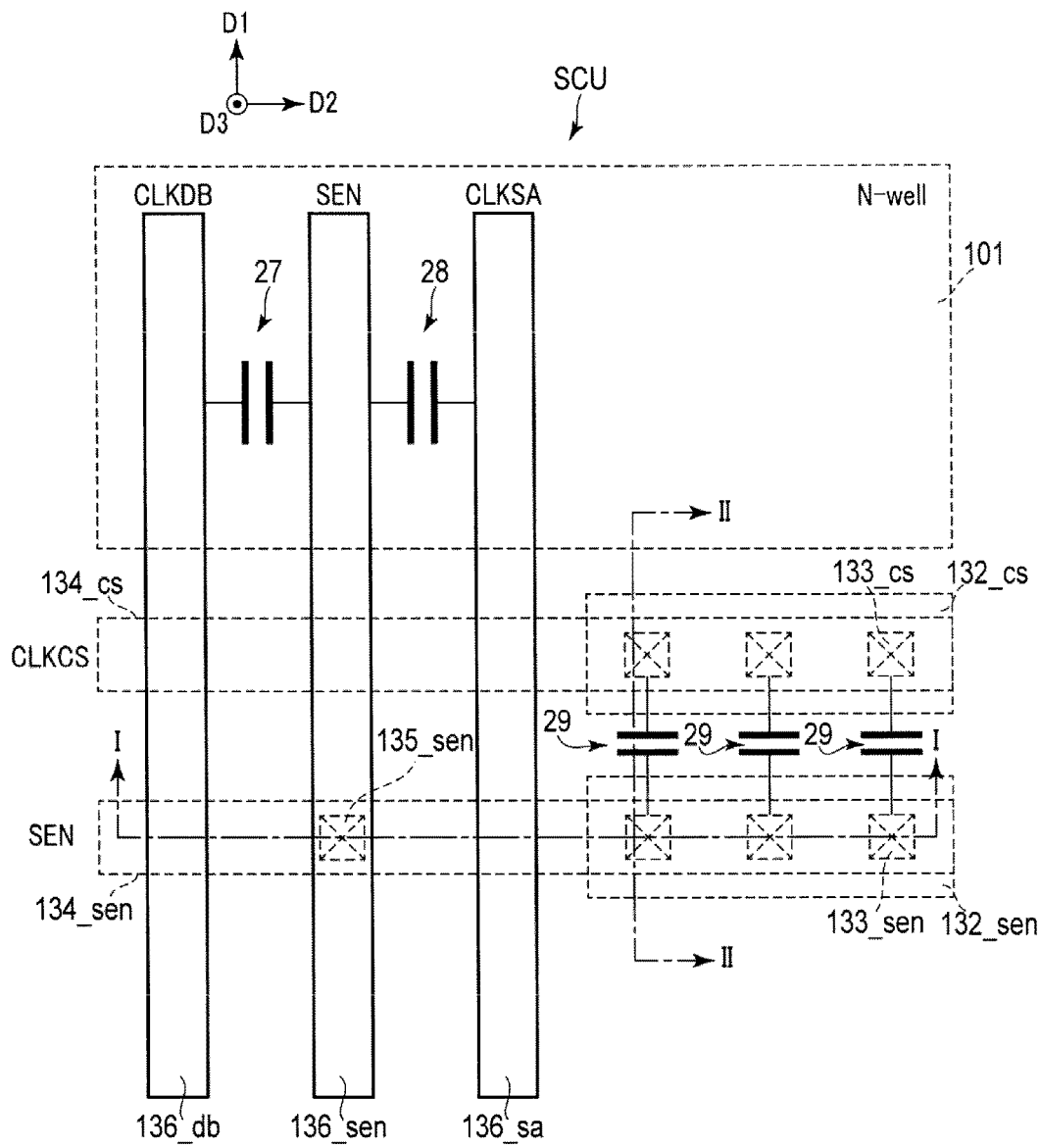
FIG. 6 is a top plan view illustrating a part of the sense amplifier unit that is provided in the semiconductor memory device according to the first embodiment.

As illustrated in FIG. 6, on an upper side of the n-type well region 101 and an element isolation area, a wiring layer 136_db that functions as a node CLKDB, a wiring layer 136_sen that functions as the node SEN, and a wiring layer 136_sa that functions as a node CLKSA are provided in the same layer along a first direction D1 parallel to the semiconductor substrate. Wiring-to-wiring capacitance between the wiring layer 136_db and the wiring layer 136_sen corresponds to the capacitive element 27, and wiring-to-wiring capacitance between the wiring layer 136_sen and the wiring layer 136_sa corresponds to the capacitive element 28.

On the upper side of the element isolation area, a wiring layer 134_cs that functions as the node CLKCS, and a wiring layer 134_sen that functions as the node SEN are provided along a second direction D2 that is parallel to the semiconductor substrate and is perpendicular to the first direction D1. The wiring layer 134_cs and the wiring layer 134_sen are provided in a layer different from the layer in the wiring layers 136_db, 136_sen, and 136_sa. The wiring layer 136_sen and the wiring layer 134_sen are connected to each other by a contact plug 135_sen.

On the upper side of the element isolation area, a wiring layer 132_cs that functions as the node CLKCS and a wiring layer 132_sen that functions as the node SEN are provided in a layer different from the layer in the wiring layer 134_cs and the wiring layer 134_sen along the second direction D2. The wiring layer 134_cs and the wiring layer 132_cs are connected to each other by a contact plug 133_cs. Furthermore, the wiring layer 134_sen and the wiring layer 132_sen are connected to each other by a contact plug 133_sen. Plug-to-plug capacitance between the contact plug 133_cs and the contact plug 133_sen corresponds to the capacitive element 29. Furthermore, the number of the contact plug 133_cs and the contact plug 133_sen is arbitrarily set. Furthermore, the wiring layers 132_cs and 132_sen, and the contact plugs 133_cs and 133_sen may be provided in a lower layer or an upper layer of the wiring layers 136_db, 136_sen, and 136_sa in a third direction D3 that is perpendicular to the semiconductor substrate.

Figure 7:
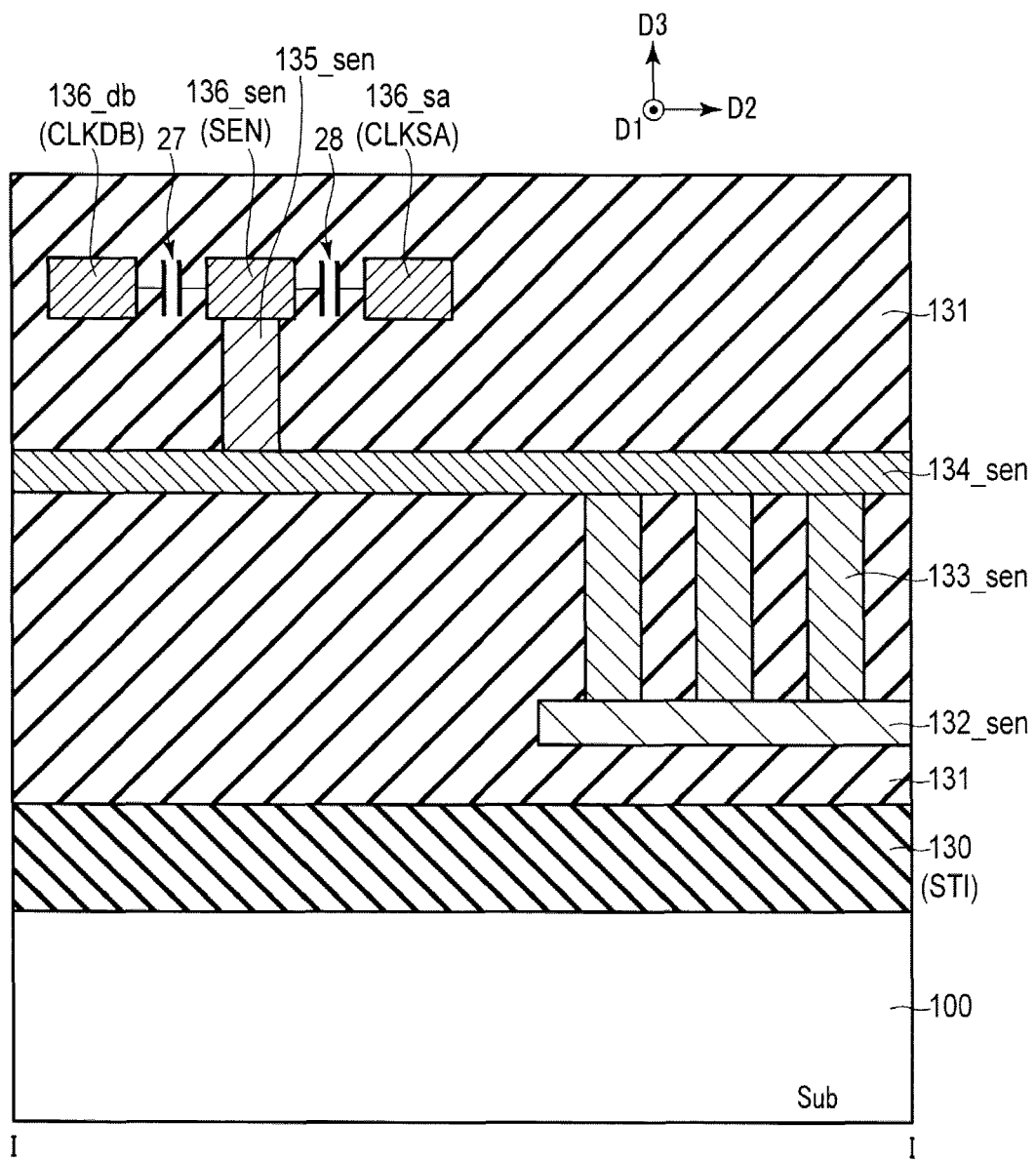
FIG. 7 is a cross-sectional view taken along line I-I in FIG. 6.
Figure 8:
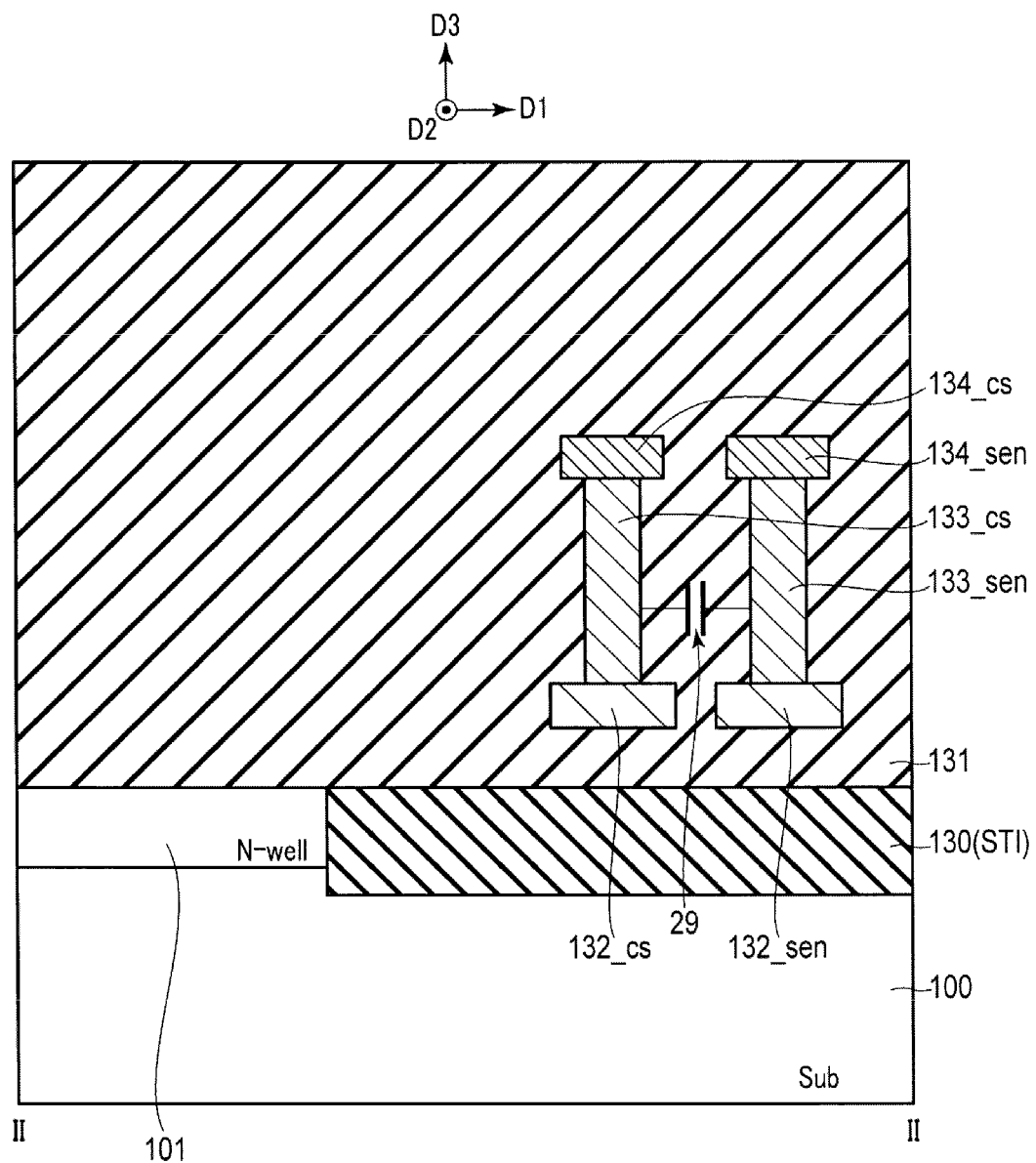
FIG. 8 is a cross-sectional view taken along line II-II in FIG. 6.
Figure 9:
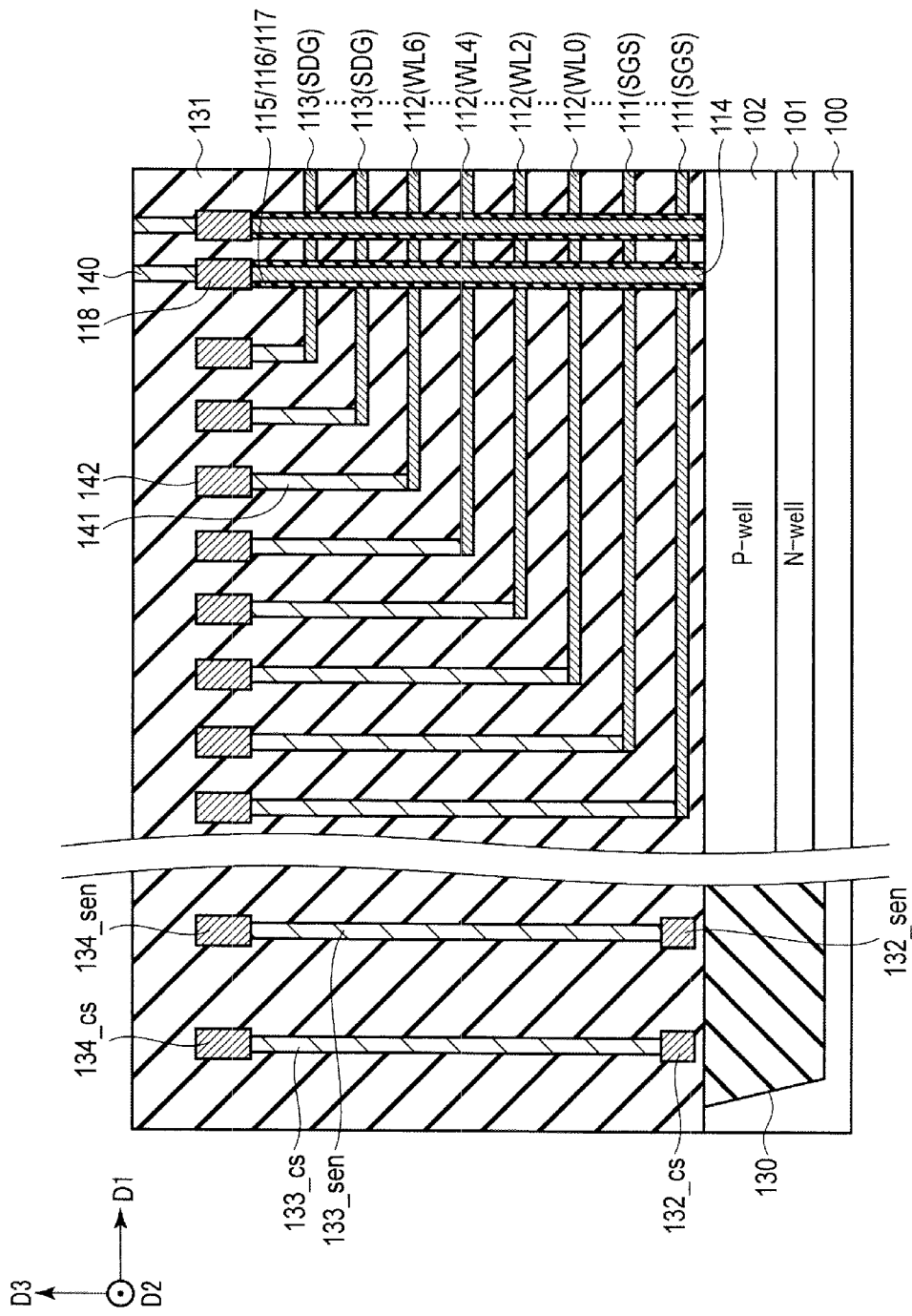
FIG. 9 is a cross-sectional view of a capacitive element that is included in the memory cell array and the sense amplifier unit which are provided in the semiconductor memory device according to the first embodiment.

Next, description will be given to a cross-sectional configuration of the wiring layers and the contact plugs. FIG. 7 is a cross-sectional view taken along line I-I in FIG. 6, and is a cross-sectional view obtained by cutting out the wiring layer 134_sen along the second direction D2. FIG. 8 is a cross-sectional view taken along line II-II in FIG. 6, and is a cross-sectional view obtained by cutting out the contact plug 133_cs and the contact plug 133_sen along the first direction D1. FIG. 9 is a cross-sectional view of the contact plugs 133_cs and 133_sen, and the memory cell array 7. More specifically, as is the case with FIG. 8, an example in FIG. 9 illustrates a cross-sectional view of the contact plugs 133_cs and 133_sen which are cut out along the first direction D1, and the memory cell array 7 that is cut out along a direction in which the word line WL extends. Furthermore, in the example of FIG. 9, parts of the wiring layers 111, 112, and 113 are omitted for simplification of explanation. In FIG. 9, description is given of a configuration different from FIG. 3 and FIG. 8.

First, as illustrated in FIG. 7, an insulating layer 130, which functions as an element isolation area, is provided on the semiconductor substrate 100. The wiring layer 132_sen is provided on an upper side of the insulating layer 130 through an insulating layer 131. The contact plug 133_sen is provided to be in contact with an upper surface of the wiring layer 132_sen, and the wiring layer 134_sen is provided to be in contact with an upper surface of the contact plug 133_sen. The contact plug 135_sen is provided to be in contact with an upper surface of the wiring layer 134_sen, and wiring layer 136_sen, which extends in the first direction D1, is provided to be in contact with an upper surface of the contact plug 135_sen. In addition, the wiring layers 136_db and 136_sa, which extend in the first direction D1, are provided in the same layer as in the wiring layer 136_sen to be adjacent to both sides of the wiring layer 136_sen, respectively.

Next, as illustrated in FIG. 8, on an upper side of the insulating layer (STI) 130, the wiring layers 132_cs and 132_sen, which extend in the second direction, are provided to be adjacent to each other. The contact plugs 133_cs and 133_sen are provided to be in contact with upper surfaces of the wiring layers 132_cs and 132_sen. In addition, the wiring layers 134_cs and 134_sen, which extend in the second direction D2, are provided to be in contact with upper surfaces of the contact plugs 133_cs and 133_sen, respectively.

Next, as illustrated in FIG. 9, a plurality of the wiring layers 111, 112, and 113 are stacked on an upper side of the semiconductor substrate 100. In addition, the insulating layer 131 is provided to cover the wiring layers 111, 112, and 113. Furthermore, the insulating layer 131 may be a stacked film. As is the case with FIG. 3, a pillar, which is formed by the conductor 114, the gate insulating film 115, the charge storage layer 116, and the block insulating film 117, that is, the NAND string 8 is provided to penetrate the wiring layers 111, 112, and 113. The wiring layer 118, which functions as the bit line BL, is connected to an upper surface of the NAND string 8. In addition, a contact plug 140 for connection with a wiring layer (not illustrated) on an upper side is provided on an upper surface of the wiring layer 118.

The wiring layers 111, 112, and 113 extend along the first direction D1, and ends of the wiring layers 111, 112, and 113 on one side protrude in a step shape. In addition, the ends of the wiring layers 111, 112, and 113 on one side are respectively connected to a wiring layer 142, which is provided in the same layer as in the wiring layer 118, through a contact plug 141.

On an upper side of the insulating layer 130, the wiring layers 132_cs and 132_sen are provided as described with reference to FIG. 8. For example, the wiring layers 132_cs and 132_sen are provided in the same layer as in a transistor gate wiring layer provided at the periphery of the memory cell array 7. In addition, for example, the wiring layers 134_cs and 134_sen are provided in the same layer as in the wiring layers 118 and 142. In the disposition as described above, the height of the contact plugs 133_cs and 133_sen becomes substantially the same as that of the NAND string 8. The height of the contact plugs 133_cs and 133_sen may be several micrometers depending on the structure of the memory cell array (height of the NAND string 8). In this case, plug-to-plug capacitance due to the contact plugs 133_cs and 133_sen may be greater than wiring-to-wiring capacitance between the wiring layers 132_cs and 132_sen or wiring-to-wiring capacitance between the wiring layers 134_cs and 134_sen.

1.2 With Respect to Threshold Voltage Distribution of Memory Cell Transistor

Next, description will be given of a threshold voltage distribution which the memory cell transistor MT according to this embodiment can take with reference to FIGS. 10A and 10B. Hereinafter, in this embodiment, description will be given of a case where the memory cell transistor MT is capable of retaining data of eight values (three bits), but the data capable of being retained is not limited to the eight values.

As illustrated in the drawing, for example, a threshold voltage of each memory cell transistors MT takes a value that is discrete and pertains to any one of eight distributions. The eight distributions are referred to as an "Er" level, an "A" level, a "B" level, a "C" level, a "D" level, a "E" level, an "F" level, and a "G" level from a low threshold side.

Figures 10A, 10B:
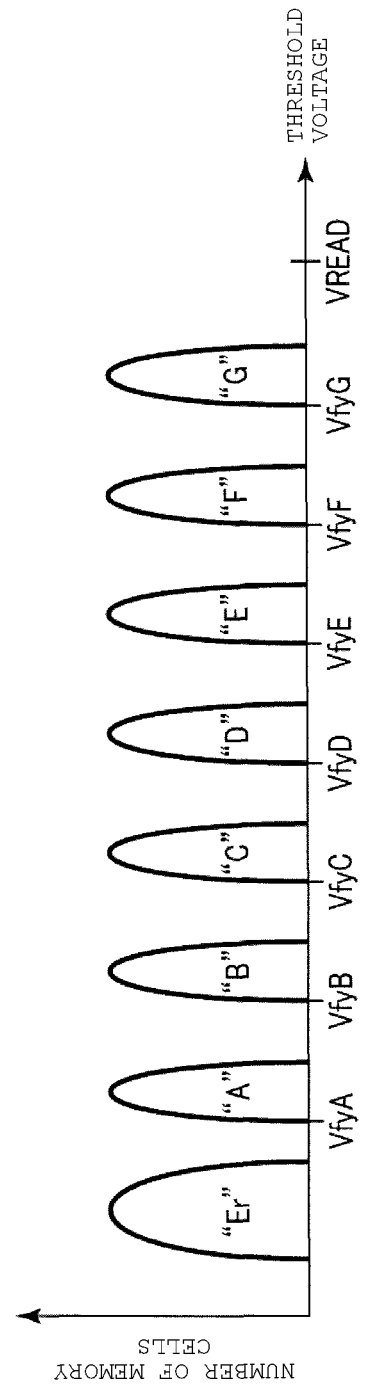
FIGS. 10A and 10B are threshold voltage distribution diagrams of a memory cell transistor that is provided in the semiconductor memory device according to the first embodiment.

As illustrated in FIG. 10B, for example, the "Er" level corresponds to an erased state of data. In addition, a threshold voltage, which is included in the "Er" level is smaller than a voltage VfyA and has a positive or negative value.

The "A" to "G" levels correspond to a state in which charges are injected to the charge storage layer and data is written, and threshold voltages included in respective distributions have, for example, a positive value. The threshold voltage, which is included in the "A" level is equal to or greater than the voltage VfyA, and is less than a voltage VfyB (it should be noted that VfyB>VfyA). The threshold voltage, which is included in the "B" level is equal to or greater than the voltage VfyB and less than a voltage VfyC (it should be noted that VfyC>VfyB). The threshold voltage, which is included in the "C" level is equal to or greater than the voltage VfyC and less than a voltage VfyD (it should be noted that VfyD>VfyC). The threshold voltage, which is included in the "D" level is equal to or greater than the voltage VfyD and less than a voltage VfyE (it should be noted that VfyE>VfyD). The threshold voltage, which is included in the "E" level is equal to or greater than the voltage VfyE and less than a voltage VfyF (it should be noted that VfyF>VfyE). The threshold voltage, which is included in the "F" level is equal to or greater than the voltage VfyF and less than a voltage VfyG (it should be noted that VfyG>VfyF). In addition, the threshold voltage, which is included in the "G" level is equal to or greater than the voltage VfyG and less than voltages VREAD and VPASS (it should be noted that VREAD>VfyG). In addition, the voltages VREAD and VPASS are voltages which are applied to a non-selected word line WL during a data read operation and a data write operation, and allow the memory cell transistor MT to enter an on-state.

As described above, the memory cell transistor MT can take any one of the eight threshold voltage distributions, and can enter eight kinds of states. When the states are allocated to "000" "111" as a binary notation, the memory cell transistor MT can retain three-bit data. The respective bits of the three-bit data may be referred to as an upper bit, an intermediate bit, and a lower bit.

As illustrated in FIG. 10A, in this embodiment, with regard to allocation of data to the "Er" to "G" levels, "Er"-level data is allocated to "111", "A"-level data is allocated to "110", "B"-level data is allocated to "100", "C"-level data is allocated to "000", "D"-level data is allocated to "010", "E"-level data is allocated to "011", "F"-level data is allocated to "001", and "G"-level data is allocated to "101". Allocation of data to the respective levels may be arbitrarily set.

Furthermore, in FIGS. 10A and 10B, an example in which eight levels are discretely distributed is described. In this case, for example, a state immediately after writing of data is an ideal state. Accordingly, actually, overlapping of adjacent levels may occur. For example, after writing of data, an upper end of the "Er" level and a lower end of the "A" level may overlap each other as a result of disturbance and the like. In this case, for example, data is corrected by using an ECC technology and the like.

1.2 With Respect to Write Operation

Next, a data write operation will be described simply. Typically, the write operation includes programming and verification. Hereinafter, a combination of the programming and the verification will be referred to as a programming loop. As the programming loop is repeated, the threshold voltage of the memory cell transistor MT rises up to a target level.

The programming is an operation of raising the threshold voltage of the memory cell transistor MT by injecting an electron to the charge storage layer (or an operation of maintaining the threshold voltage by inhibiting the injection). For example, during the programming, when the latch circuit SDL retains "0" data, the threshold voltage of the memory cell transistor MT that is the target rises, and when the latch circuit SDL retains "1" data, the threshold voltage of the memory cell transistor MT that is the target is maintained (writing is inhibited). Hereinafter, programming corresponding to "0" data is referred to as "0" programming, and programming corresponding to the "1" data is referred to as "1" programming.

In this embodiment, in the "0" programming, any one of a first programming condition in which the amount of variation of the threshold voltage is relatively great, and a second programming condition in which the amount of variation of the threshold voltage is relatively smaller in comparison to the first programming condition is applied in accordance with a difference between a target verification level (for example, the voltage VfyA corresponding to the "A" level) and the threshold voltage of the memory cell transistor MT. For example, when the threshold voltage of the memory cell transistor MT is sufficiently lower than the verification level, and the target verification level is not reached with the programming performed once, the first programming condition, in which the amount of variation of the threshold voltage is relatively great, is applied. In addition, when the threshold voltage of the memory cell transistor MT is relatively close to the target verification level, and the threshold voltage is likely to greatly exceed the verification level if the first programming condition is applied, the second programming condition is applied.

More specifically, the first programming condition and the second programming condition are different in a voltage of the bit line BL. For example, the voltage VSS is applied to the bit line BL corresponding to the first programming condition. In addition, a voltage, which is applied to the bit line BL corresponding to the second programming condition, is set as VQPW, and a voltage, which is applied to the bit line BL corresponding to the "1" programming, is set as VBL. In this case, the voltage VSS, the voltage VQPW, and the voltage VBL satisfy a relationship of VBL>VQPW>VSS.

Furthermore, in this embodiment, description is given of the case where the first and second programming conditions are applied during the "0" programming, but there is no limitation thereto. For example, the number of programming conditions corresponding to the "0" programming may be one, three, or greater than three.

Hereinafter, in the "0" programming, a bit line to which the first programming condition is applied is described as BL ("0"), and a bit line to which the second programming condition is applied is described as BL ("QPW"). In addition, a bit line corresponding to the "1" programming is described as BL ("1").

The verification is an operation of reading data after the programming, and determining whether or not the threshold voltage of the memory cell transistor MT reaches a target level. Hereinafter, a case where the threshold voltage of the memory cell transistor MT reaches the target level is referred to as "passes verification", and a case where the threshold voltage does not reach the target level is referred to as "fails in verification".

In this embodiment, after the programming, first verification and second verification, which are different in the target level, are executed. In the first verification, a voltage (hereinafter, referred to as "voltage VL"), which is lower than the verification level, is set as the target level. In the second verification, for example, the same voltage (hereinafter, referred to as "voltage VH") as the verification level is set. When the first verification fails (threshold voltage<VL), the first programming condition is applied in the subsequent programming. When the first verification passes, and the second verification fails (VL≤threshold voltage<VH), the second programming condition is applied in the subsequent programming. When the second verification (VH≤threshold voltage) passes, writing is inhibited in the subsequent programming.

The first verification and the second verification are different in periods of sensing a voltage of the bit line BL (that is, a state of the memory cell transistor MT that is a target), that is, periods in which a signal XXL is set to an "H" level and charges of the node SEN are transferred to the bit line BL. Hereinafter, a sense operation in the first verification is referred to as a "first sense (1st sense)", and a sense period thereof is referred to as a "first sense period". In addition, a sense operation in the second verification is referred to as a "second sense (2nd sense)", and a sense period thereof is referred to as a "second sense period".

A rate in which the voltage of the node SEN decreases is different depending on a potential difference between the threshold voltage of the memory cell transistor MT and the verification level. For example, when the threshold voltage is less than a voltage VL (first verification level), the memory cell transistor MT, which is the target, enters a strong on-state. In this case, the voltage of the node SEN rapidly decreases. In addition, when the threshold voltage is equal to or greater than the voltage VL and less than the voltage VH (second verification level), the memory cell transistor MT enters a weak on-state. In this case, the potential of the node SEN decreases in a relatively gentle manner. According to this, when the first sense period and the second sense period are set as periods different from each other, it is possible to determine whether the memory cell transistor MT has a threshold voltage that is equal to or greater than the voltage VL and less than the voltage VH.

More specifically, the first sense period is set to be shorter than the second sense period. Since the first sense period is shorter than the second sense period, the memory cell transistor MT that enters the strong on-state, that is the memory cell transistor MT having the threshold voltage less than the voltage VL is determined to have failed the first verification, and the memory cell transistor MT having the threshold voltage, which is equal to or greater than the voltage VL, is determined to have passed the first verification. On the other hand, since the second sense period is longer than the first sense period, a voltage of the node SEN corresponding to the memory cell transistor MT, which enters the weak on-state, sufficiently decreases. According to this, the memory cell transistor MT, which has the threshold voltage less than the voltage VH (second verification level), is determined to have failed the second verification, and the memory cell transistor MT, which has the threshold voltage equal to or greater than the voltage VH, is determined to have passed the second verification.

Furthermore, the verification described in, for example, U.S. patent application Ser. No. 13/052,148, filed Mar. 21, 2011 with a title of "THRESHOLD DETECTING METHOD AND VERIFY METHOD OF MEMORY CELLS," maybe applied. The entire contents of this patent application are incorporated herein by reference.

1.2.1 With Respect to Overall Flow of Write Operation

Figure 11:
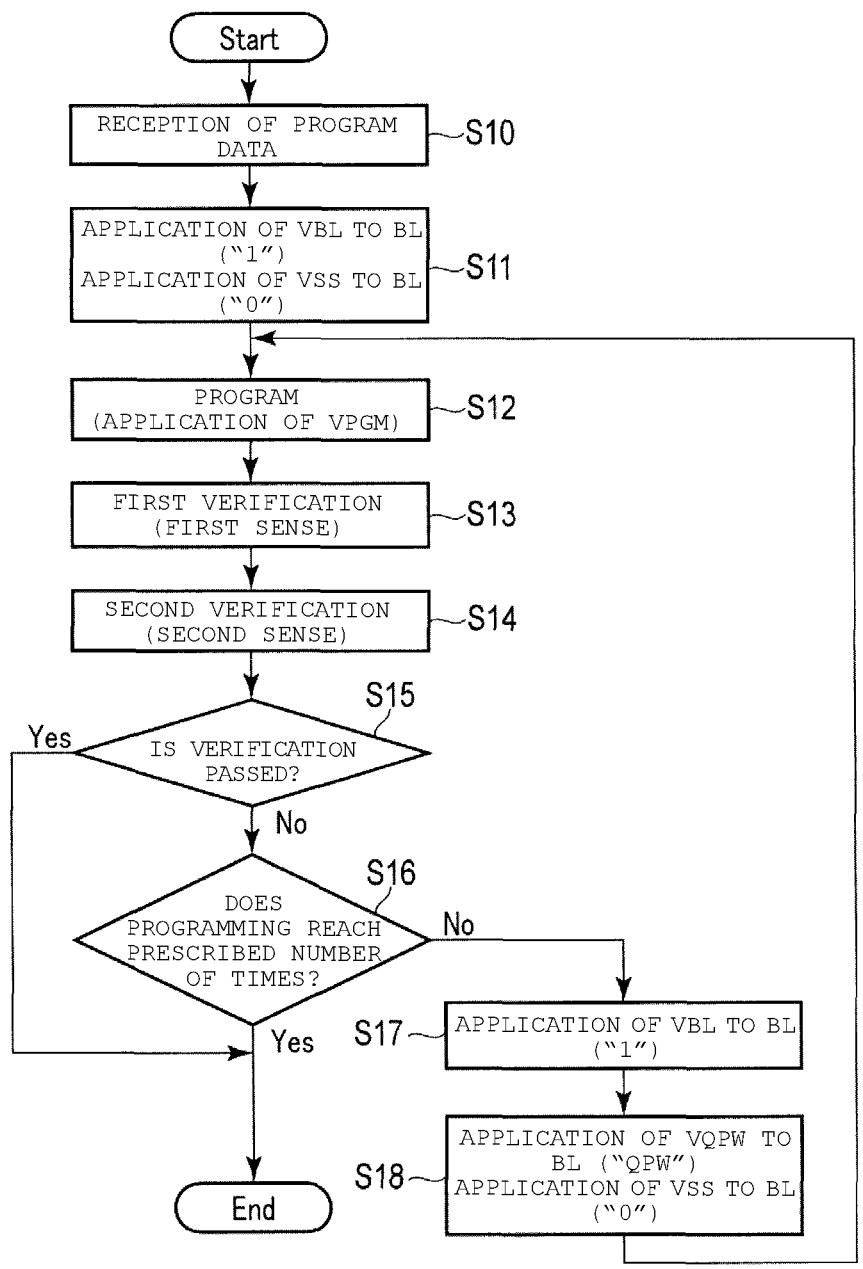
FIG. 11 is a flowchart illustrating a write operation of the semiconductor memory device according to the first embodiment.

First, description will be given of an overall flow of the write operation with reference to FIG. 11. Furthermore, in this embodiment, description will be given of a case of executing a verification operation corresponding to one verification level in a programming loop performed once to simplify the explanation, but when the memory cell transistor MT retains multi-value data (two bits or greater), a verification operation corresponding to a plurality of verification levels may be executed in a programming loop performed once.

As illustrated in the drawing, the control circuit 2 receives program data that is received from an external controller (step S10). For example, the program data, which is received from the external controller, is three-bit data, including an upper bit, an intermediate bit, and a lower bit, that are respectively stored in the latch circuits ADL, BDL, and CDL. in addition, the data, which is stored in the latch circuit ADL, BDL, and CDL are subjected to a logical operation in accordance with a writing level ("A" to "G" levels), and the results are stored in the latch circuit SDL. More specifically, for example, when performing writing of "A" level, an AND operation by data of the latch circuits ADL, BDL, and CDL is performed, and "1" data ("H" level) is stored in a latch circuit SDL corresponding to the "Er" level, and "0" data ("L" level) is stored in latch circuits SDL corresponding to the "A" to "G" levels.

Next, the sense amplifier 5 charges the bit line BL in accordance with data that is retained by the latch circuit SDL (hereinafter, referred to as "BL precharge"). During the first programming, the second programming condition is not applied, and thus the voltage VSS is applied to the bit line BL ("0") in correspondence with the "0" data, that is, the "0" programming, and the voltage VBL is applied to the bit line BL ("1") in correspondence with the "1" data, that is, the "1" programming (step S11).

Next, the row decoder 4 applies a voltage VPGM to a selected word line WL, and writes data in the memory cell transistor MT that is the target (step S12). More specifically, the row decoder 4 selects any one word line WL in a selected block BLK, applies the voltage VPGM to the selected word line WL, and applies the voltage VPASS to the other non-selected word lines WL. The voltage VPGM is a high voltage for injection of an electron to the charge storage layer. The voltage VPASS is a voltage that allows the memory cell transistor MT to enter an on-state regardless of the threshold voltage of the memory cell transistor MT. The voltage VPGM and the voltage VPASS satisfy a relationship of VPGM>VPASS. According to this, "1" or "0" data is written to the memory cell transistor MT that is the target.

Next, the control circuit 2 executes first verification (Step S13). During the first verification, the first sense in accordance with the voltage VL as the target level of the threshold voltage is executed. In addition, in accordance with the first verification result, for example, data of the latch circuit TDL is updated.

Next, the control circuit 2 executes the second verification (step S14). During the second verification, the second sense in accordance with the voltage VH as the target level of the threshold voltage is executed. In addition, in accordance with the second verification result, for example, data of the latch circuit SDL is updated.

Next, the control circuit 2 performs verification determination (step S15). More specifically, when the number of failed bits through the second verification is less than a prescribed number that is set in advance, the control circuit 2 determines that the verification has passed (Yes in step S15), and terminates the write operation.

On the other hand, when the number of failed bits is equal to or greater than the prescribed number, the control circuit 2 determines that the verification has failed (No in step S15). In addition, when the number of times of the programming reaches a prescribed number of times that is set in advance (Yes in step S16), the control circuit 2 terminates the write operation, and notifies an external device of a situation in which the write operation is not normally terminated.

In addition, when the number of times of the programming does not reach the prescribed number of times (No in step S16), the control circuit 2 performs a transition to a next programming loop.

More specifically, first, the sense amplifier 5 updates data of the latch circuit SDL in accordance with the second verification result, applies the voltage VBL to the bit line BL ("1"), and applies the voltage VSS to the bit line ("QPW") and the bit line BL ("0") (step S17).

Next, the sense amplifier 5 updates data of the latch circuit SDL in accordance with the first verification result (data of the latch circuit TDL), and applies the voltage VQPW to the bit line BL("QPW") in accordance with data of the latch circuit SDL (step S18). At this time, the bit line BL ("1") enters a floating state, and thus the voltage VQPW is not applied thereto. In addition, the voltage VSS is applied to the bit line BL ("0").

Next, returning to step S12, the row decoder 4 applies the voltage VPGM to a selected word line WL, and the subsequent programming is executed.

1.2.2 With Respect to Voltage of Each Wiring in Programming

Next, description will be given of a voltage of each wiring in programming with reference to FIG. 12.

Figure 12:
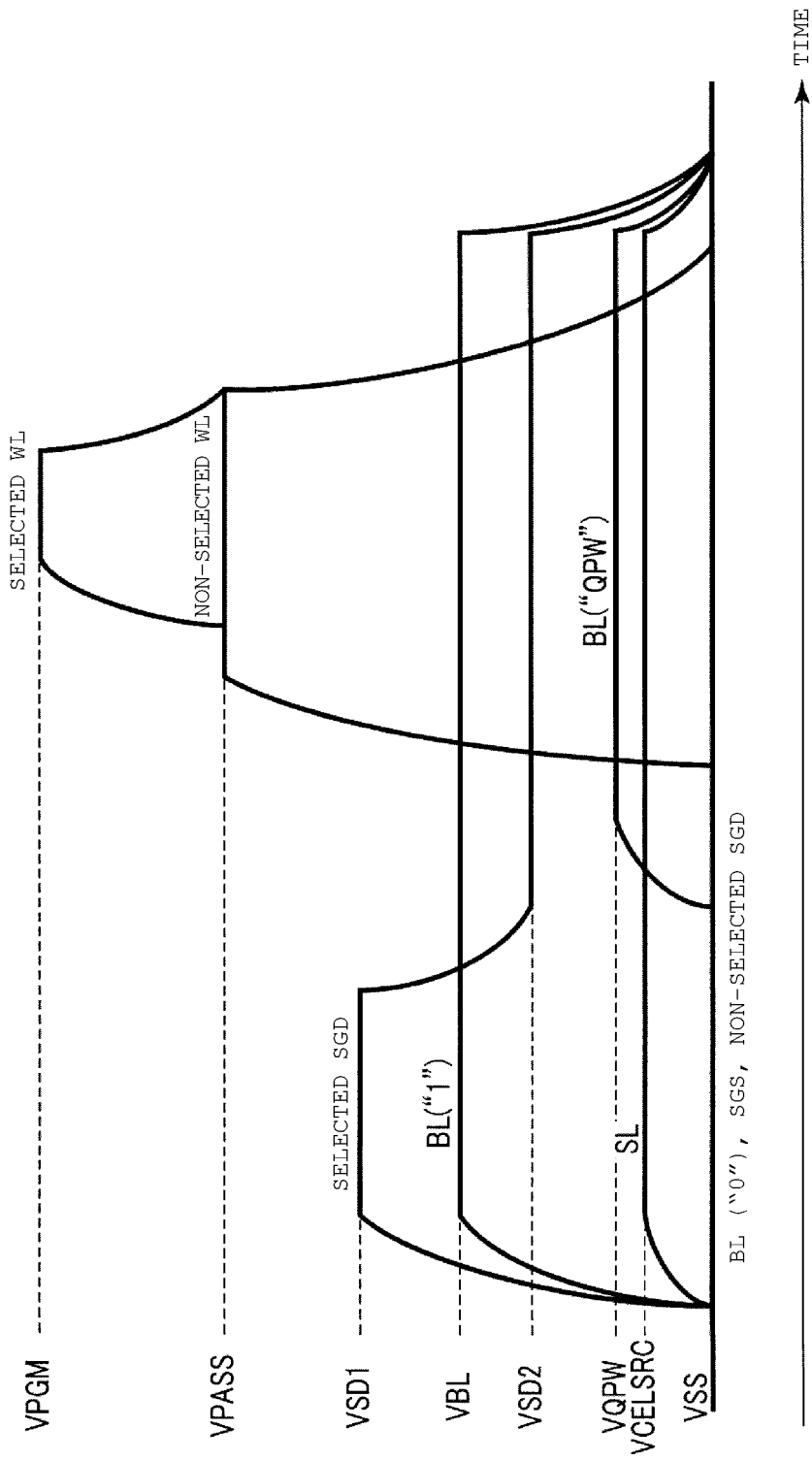
FIG. 12 is a timing chart illustrating a potential of each wiring during programming of the semiconductor memory device according to the first embodiment.

FIG. 12 illustrates a potential variation of each wiring in the programming operation. As illustrated in the drawing, first, the sense amplifier 5 precharges each bit line BL in accordance with data of the latch circuit SDL. More specifically, in the sense amplifier unit SAU, when the "1" data ("H"-level data) is retained in the latch circuit SDL, the node INV_S becomes the "L" level, and thus the transistor 17 enters an on-state. In this state, the signals BLS and BLX become the "H" level, and the transistors 10 and 13 enter an on-state. In addition, when the signal BLC becomes the "H" level, and a voltage of "VBL+Vt11" (Vt11 represents a threshold voltage of the transistor 11) is applied to a gate of the transistor 11, the voltage VBL is applied to the bit line BL. That is, the voltage VBL is applied to the bit line BL ("1"). On the other hand, when the "0" data (data of the "L" level) is retained in the latch circuit SDL, the node INV_S becomes the "H" level, and thus the transistor 15 enters an on-state. When the voltage VSS is applied to the node SRCGND, the voltage VSS is applied to a corresponding bit line BL. That is, the voltage VSS is applied to the bit line BL ("0") and the bit line BL ("QPW").

In addition, the row decoder 4 selects anyone block BLK, and selects any one string unit SU. In addition, the row decoder 4 applies a voltage VSD1 to a select gate line SGD in the selected string unit SU. When a threshold voltage of the select transistor ST1 is set to Vtsg, the voltage VSD1 is a voltage that is equal to or greater than "VBL+Vtsg" and allows the select transistor ST1 to enter an on-state. On the other hand, when the voltage VSS is applied to the select gate line SGS, the select transistor ST2 enters an off-state.

In addition, the row decoder 4 applies the voltage VSS to a select gate lines SGD and SGS of non-selected string units SU in the selected block BLK, and non-selected string units SU in non-selected blocks BLK to allow the select transistors ST1 and ST2 to enter an off-state.

In addition, for example, a voltage VCELSRC (>VSS) is applied to the source line SL through a source line driver (not illustrated).

Then, the row decoder 4 applies a voltage VSD2 to a selected gate line SGD in the selected string unit SU in the selected block BLK. The voltage VSD2 is a voltage that is lower than the voltage VSD1 and the voltage VBL, and turns on a select transistor ST1 to which the voltage VSS is applied, and cuts off a select transistor ST1 to which the voltage VBL is applied. According to this, a channel of the NAND string 8 corresponding to the bit line BL ("1") enters a floating state. In addition, the sense amplifier 5 sets an "H"-level voltage of the signal BLC to "VQPW+Vt11" in the transistor 11 in the sense amplifier unit SAU. The voltage VSD2 and the voltage VPQW satisfy a relationship of VSD2>VPQW. According to this, in a sense amplifier unit SAU corresponding to the bit line BL ("1") to which the voltage VBL is applied, the transistor 11 enters a cut-off state, and the bit line BL ("1") enters a floating state.

Next, for example, the sense amplifier 5 updates data of the latch circuit SDL in accordance with data of the latch circuit TDL. As a result, in a sense amplifier unit SAU corresponding to the bit line BL ("QPW"), data of the latch circuit SDL is updated form "0" data to "1" data. Accordingly, the sense amplifier 5 applies the voltage VQPW to the bit line ("QPW")

Next, the row decoder 4 selects any one word line WL in a selected block BLK, applies the voltage VPGM to the selected word line, and applies the voltage VPASS to the other non-selected word lines WL.

In the NAND string 8 corresponding to the bit line BL ("0"), the select transistor ST1 enters an on-state. In addition, a channel potential of the memory cell transistor MT, which is connected to the selected word line WL, becomes VSS. Accordingly, a potential difference between a control gate and a channel increases. As a result, an electron is injected to the charge storage layer, and the threshold voltage of the memory cell transistor MT rises.

In the NAND string 8 corresponding to the bit line BL ("1"), the select transistor ST1 enters a cut-off state. According to this, the channel of the memory cell transistor MT, which is connected to the selected word line WL, is electrically floating, and the channel potential rises due to capacitive coupling with the word line WL and the like. Accordingly, the potential difference between the control gate and the channel decreases. As a result, an electron is not injected to the charge storage layer, and the threshold voltage of the memory cell transistor MT is maintained (the threshold voltage does not vary to a certain extent in which a threshold voltage distribution level transitions to a higher threshold voltage distribution).

In the NAND string 8 corresponding to the bit line BL ("QPW"), the select transistor ST1 enters an on-state. In addition, the channel potential of the memory cell transistor MT, which is connected to the selected word line WL, becomes VQPW (>VSS). Accordingly, the potential difference between the control gate and the channel becomes smaller in comparison to a case where the channel potential is VSS. As a result, the amount of electrons injected to the charge storage layer becomes smaller in comparison to the memory cell transistor MT corresponding to the bit line BL ("0"), and the amount of variation of the threshold voltage of the memory cell transistor MT decreases.

Figure 13:
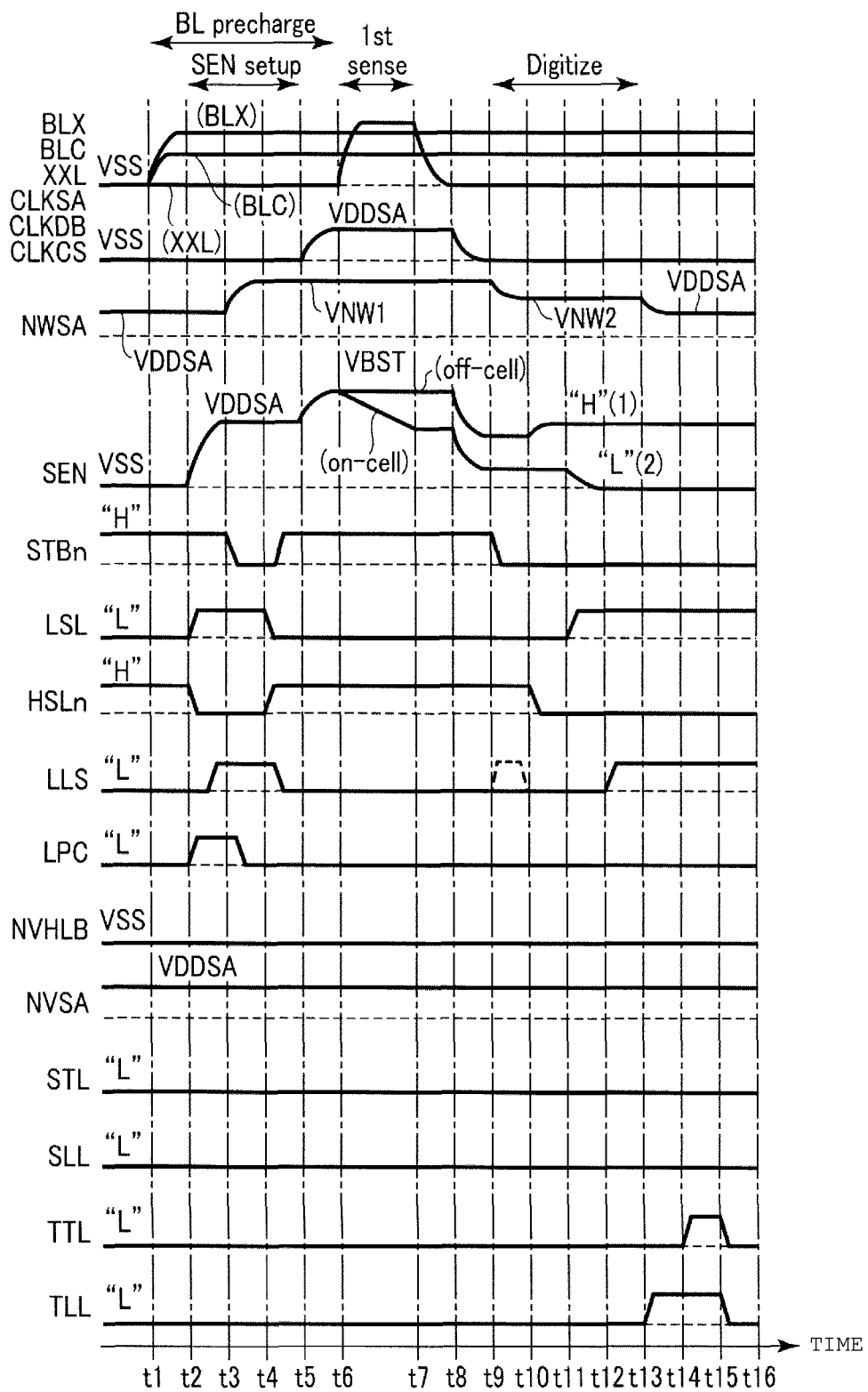
FIG. 13 is a timing chart illustrating a potential of each wiring of the sense amplifier during verification of the semiconductor memory device according to the first embodiment.
Figure 14:
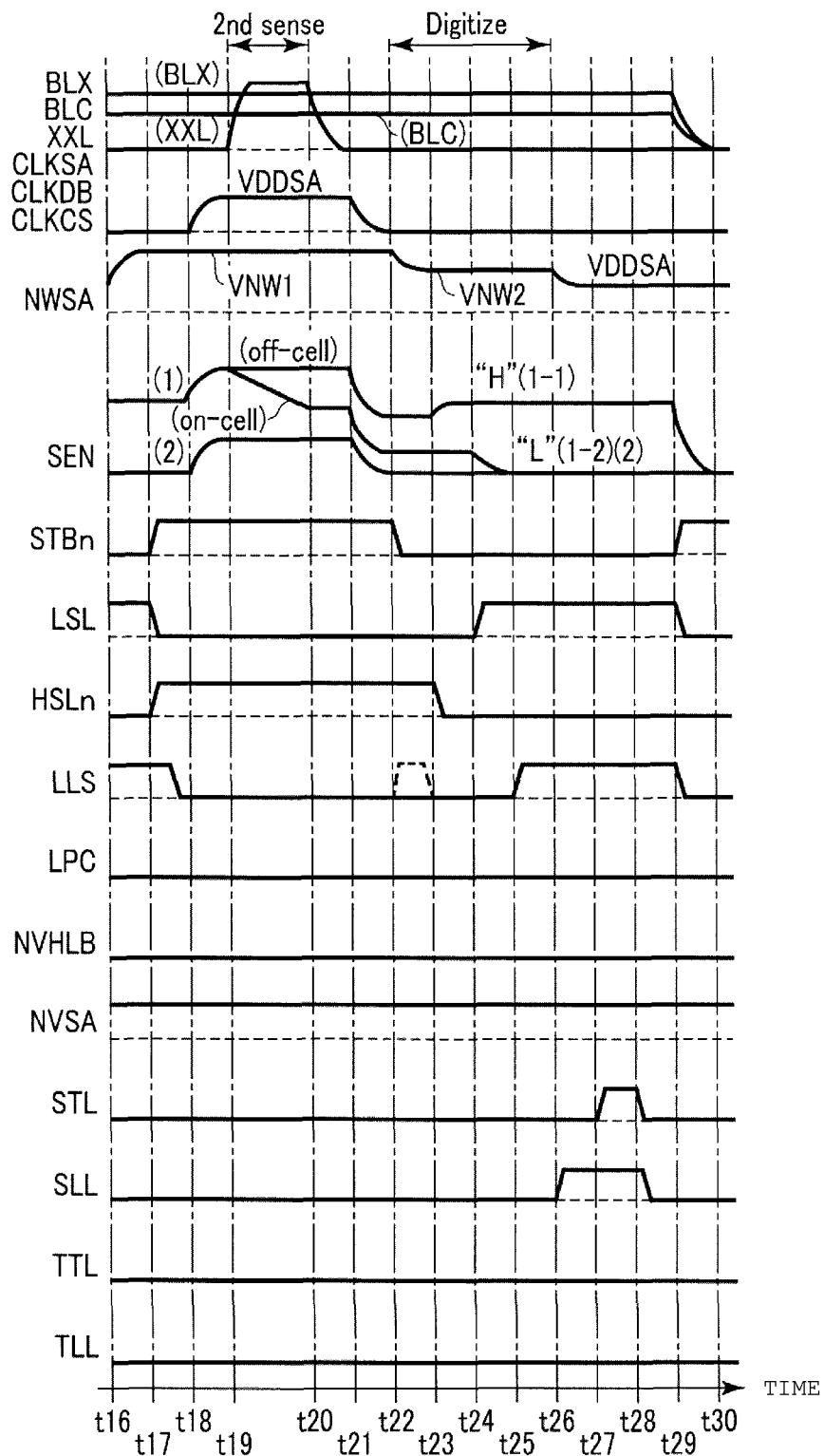
FIG. 14 is a timing chart illustrating a potential of each wiring of the sense amplifier during verification of the semiconductor memory device according to the first embodiment.

1.2.3 With Respect to Voltage of Each Wiring of Sense Amplifier Unit in Verification Next, description will be given of a voltage of each wiring in the sense amplifier unit SAU in verification with reference to FIG. 13 and FIG. 14. An example of FIG. 13 and FIG. 14 illustrates a continuous timing chart when executing first verification and second verification. The first verification is executed from time t1 to t16 in FIG. 13, and the second verification is executed from time t16 to t30 in FIG. 14.

This example illustrates a case where in the first verification, precharge is performed for all bit lines BL that is the target, and in the second verification, precharge is performed for only a bit line BL which fails in the first verification. Furthermore, in this embodiment, description will be given of a case where a first sense period in the first verification is shorter than a second sense period in the second verification, but there is no limitation thereto. For example, the sense periods in the first verification and the second verification may be set to be the same as each other, and read voltages VCGRV in the first verification and the second verification may be different from each other. The voltage VCGRV is a voltage that is applied to a selected word line WL during verification, and is set in accordance with a verification level. The voltage VCGRV and the voltage VREAD satisfy a relationship of VCGRV<VREAD. For example, the row decoder 4 may apply a voltage VCGRV1 (=VL) to a selected word line WL in the first verification, and may apply a voltage VCGRV2 (=VH) to the selected word line WL in the second verification.

First, the first verification will be described. As illustrated in FIG. 13, at time t1, the control circuit 2 sets the signals BLC and BLX to an "H level". An "H"-level voltage value of the signal BLX is higher than an "H"-level voltage value "VBL+Vt11" of the signal BLC. When the transistor 17 and the transistor 10 enter an on-state, the voltage VBL, which is clamped in the transistor 11 (signal BLC), is applied to a corresponding bit line BL. Precharge of the bit line BL is performed from time t1 to t6.

The voltage generation circuit 3 applies the voltage VDDSA to the node NWSA by control of the control circuit 2. In addition, the voltage generation circuit 3 applies the voltage VDDSA to the node NVSA, and applies the voltage VSS to the node NVHLB. In addition, the voltage generation circuit 3 applies the voltage VSS to the nodes CLKSA, CLKDB, and CLKCS.

At time t2, the control circuit 2 set the signal LPC to an "H" level to allow the transistor 30 to enter an on-state. According to this, the voltage VSS is applied to the bus LBUS through the node NVHLB, and the bus LBUS becomes an "L" level. In addition, the control circuit 2 set the signal LSL and the signal HSLn to the "H" level and the "L" level, respectively, to allow the transistors 21 and 24 to enter an on-state. Since the bus LBUS is in the "L" level, the transistor 26 enters an on-state, and the voltage VDDSA is applied to the node SEN through the node NVSA.

After the transistors 21 and 24 enter an on-state, from time t2 to t3, the control circuit 2 sets the signal LLS to the "H" level to allow the transistor 20 to enter an on-state. The voltage VDDSA is applied to the node SEN, and thus the transistor 18 enters an on-state. According to this, the bus LBUS is electrically connected to the node CLKSA, and the voltage VSS is applied to the bus LBUS. That is, the latch circuit, which is constituted by the transistors 18, 19, 25, and 26 in the scan unit SCU, enters a state in which the node SEN retains "H"-level data, and the bus LBUS retains "L"-level data.

At time t3, the control circuit 2 set the signal STBn to the "L" level to allow the transistor 23 to enter an on-state. Since the transistors 20, 21, 23, and 24 enter an on-state, a logical level of the retention data of the node SEN is determined by the scan unit SCU.

In addition, the voltage generation circuit 3 applies a voltage VNW1, which is higher than the voltage VDDSA, to the node NWSA. The voltage VNW1 is a voltage higher than a voltage VEST of the node SEN to be described later.

From time t3 to t4 after the transistor 23 enters an on-state, the control circuit 2 sets the signal LPC to the "L" level to allow the transistor 30 to enter an off-state. The voltage VSS is not applied from the LBUS precharge circuit PCC to the bus LBUS. Accordingly, in the bus LBUS, a logical level of the retention data is determined by the scan unit SCU. That is, the node SEN retains the "H"-level data, the bus LBUS retain "L"-level data that is inverted data of the retention data of the node SEN.

At time t4, the control circuit 2 sets the signal LSL and the signal HSLn to the "L" level and the "H" level, respectively, to allow the transistor 21 and 24 to enter an off-state. The node SEN enters a floating state, and retains "H"-level data (voltage VDDSA) regardless of the retention data of the bus LBUS.

After the transistors 21 and 24 enters an off-state, from time t4 to t5, the control circuit 2 sets the signal STBn and the signal LLS to the "H" level and the "L" level, respectively, to allow the transistors 20 and 23 to enter an off-state. The bus LBUS enters a floating state and retains "L"-level data. That is, from time t2 to t5, the voltage VDDSA is charged to the node SEN, and the node SEN enters a floating state (hereinafter, referred to as "set-up").

At time t5, the voltage generation circuit 3 applies the voltage VDDSA to the node CLKSA, the node CLKDB, and the node CLKCS (hereinafter, referred to as "clock-up"). As a result, the capacitive elements 27 to 29 are charged, and the voltage of the node SEN rises to the voltage VBST due to an effect of capacitive coupling. The voltage VBST is a voltage of the node SEN, which rises due to the clock-up, and is higher than the voltage VDDSA.

From time t6 to t7, the control circuit 2 performs first sense. Specifically, from time t6 to t7, the control circuit 2 sets the signal XXL to the "H" level to allow the transistor 16 to enter an on-state. An "H"-level voltage value of the signal XXL is higher than an "H"-level voltage value of the signal BLX. In this state, when the threshold voltage of the memory cell transistor MT, which becomes a verification target, is equal to or greater than the first verification level, the memory cell transistor MT enters an off-state (hereinafter, referred to as "off-cell"), and a current hardly flows from a corresponding bit line BL to the source line SL. Accordingly, the charges, which are charged to the node SEN and the capacitive elements 27 to 29, are hardly discharged, and thus a voltage value of the node SEN hardly varies. On the other hand, when the threshold voltage of the memory cell transistor MT, which becomes a verification target, is less than the first verification level, the memory cell transistor MT enters an on-state (hereinafter, referred to as "on-cell"), and a current flows from a corresponding bit line BL to the source line SL. The "H"-level voltage value of the signal XXL is higher than the "H"-level voltage value of the signal BLX, and thus charges, which are charged to the node SEN and the capacitive elements 27 to 29, are discharged. That is, the voltage of the node SEN lowers.

At time t8, the voltage generation circuit 3 applies the voltage VSS to the node CLKSA, the node CLKDB, and the node CLKCS (hereinafter, referred to "clock-down"). As a result, the voltage of the node SEN lowers due to an effect of capacitive coupling.

When the threshold voltage of the sense transistor 25 is set to Vt25, a determination voltage of the node SEN in the transistor 25 becomes "VDDSA−Vt25". Specifically, a voltage of the node SEN corresponding to off-cell becomes "VDDSA−Vt25" to VDDSA. In addition, a voltage of the node SEN corresponding to an on-cell becomes equal to or greater than VSS and less than "VDDSA−Vt25".

At time t9, the voltage generation circuit 3 applies a voltage VNW2 to the node NWSA. The voltage VNW2 is a voltage that is applied so as to suppress a variation of a threshold voltage of the sense transistor 25, and an optimal value thereof is different for each chip (NAND-type flash memory 1). The voltage VNW1, the voltage VNW2, and the voltage VDDSA satisfy a relationship of VNW1>VNW2>VDDSA. In this state, first, the control circuit 2 sets the signal STBn to the "L" level to allow the transistor 23 to enter an on-state. The transistor 25 corresponding to an off-cell is in the off-state, the bus LBUS maintains the "L" level. The transistor 25 corresponding to an on-cell is in the on-state, and thus the voltage VDDSA ("H" level) is applied to the bus LBUS.

From time t9 to t10, the control circuit 2 may set the signal LLS to the "H" level to allow the transistor 20 to enter an on-state. For example, the voltage (VSS) of the bus LBUS in the floating state rises due to an effect of adjacent wirings (capacitive coupling), and thus there is a possibility that the "L" level (voltage VSS) cannot be maintained. In this case, the transistor 20 is turned on to determine the "L" level of the retention data of the bus LBUS again. Furthermore, the control circuit 2 may not set the signal LLS to the "H" level.

At time t10, the control circuit 2 sets the signal HSLn to the "L" level to allow the transistor 24 to enter an on-state. When the retention data of the bus LBUS is in the "L" level, that is, in a case of an off-cell, the transistor 26 enters an on-state. Accordingly, the voltage VDDSA is applied to the node SEN ((1) in FIG. 13), and the node SEN becomes the "H" level. That is, in the node SEN (1) corresponding to an off-cell, a logical level of the retention data is determined to be the "H" level.

At time t11, the control circuit 2 sets the signal LSL to the "H" level to allow the transistor 21 to enter an on-state. When the retention data of the bus LBUS is in the "H" level, that is, in a case of an on-cell, the transistor 19 enters an on-state, and thus the voltage VSS is applied to the node SEN ((2) in FIG. 13), and the node SEN becomes the "L" level. Accordingly, in the node SEN (2) corresponding to an on-cell, a logical level of the retention data is determined to be the "L" level.

At time t12, the control circuit 2 sets the signal LLS to the "H" level to allow the transistor 20 to enter an on-state. According to this, the transistors 20, 21, 23, and 24 enters an on-state, and thus a logical level of the retention data of the node SEN is determined by the scan unit SCU. That is, from time t9 to t13, "digitizing" of the node SEN is executed.

At time t13, when the "digitizing" is completed, the voltage generation circuit 3 applies the voltage VDDSA to the node NWSA. In addition, the control circuit 2 updates the latch circuit TDL in accordance with the first verification result. Accordingly, in the latch circuit TDL, the signal TLL is set to the "H" level to allow the transistor 86 to enter an off-state.

At time t14, the control circuit 2 sets the signal TTL to an "H" state to allow the transistor 80 to enter an on-state. In a sense amplifier unit SAU corresponding to the node SEN (1) that retains "H"-level data, the bus LBUS retains "L"-level data, and thus the node LAT_T of the latch circuit TDL also retains the "L"-level data. On the other hand, in a sense amplifier unit SAU with respect to the node SEN (2) that retains the "L"-level data, the bus LBUS retains the "H"-level data, and thus the node LAT_T of the latch circuit TDL also retains the "H"-level data.

At time t15, the control circuit 2 sets the signal TTL to the "L" level to allow the transistor 80 to enter an off-state, and sets the signal TLL to the "H" level to allow the transistor 86 to enter an on-state. According to this, the logical data of the latch circuit TDL is determined, and the first verification is terminated.

Next, the second verification will be described. The second verification is different from the first verification in that the logical level of the node SEN is determined at the time of terminating the first verification, and thus the set-up of the node SEN is omitted. In addition, in this example, the latch circuit SDL is updated in accordance with a result of the second verification. In the following description, description will be given of only a difference from the first verification.

As illustrated in FIG. 14, at time t16, the voltage generation circuit 3 applies the voltage VNW1, which is higher than the voltage VDDSA, to the node NWSA.

An operation from time t17 to t26 is substantially the same as the operation from time t4 to t13. From time t19 to t20, the second sense is executed, and from time t22 to t26, the "digitizing" is executed. In the second verification, the set-up of the node SEN is not executed differently from the first verification. According to this, in the node SEN (2) corresponding to a memory cell transistor MT that becomes an on-cell in the first verification, the second sense is executed in a state in which the retention data is in the "L" level (a state in which the voltage value of the node SEN is VSS). From a result of the second verification, a node SEN (1-1) corresponding to a memory cell transistor MT, which becomes an off-cell in the first verification and the second verification, retains "H"-level data. A node SEN (1-2) corresponding to a memory cell transistor MT, which becomes an off-cell in the first verification and becomes an on-cell in the second verification, retains "L"-level data similar to the node SEN (2) corresponding to the memory cell transistor MT that becomes an on-cell in the first verification.

At time t26, the voltage generation circuit 3 applies the voltage VDDSA to the node NWSA. In addition, the control circuit 2 updates the latch circuit SDL in accordance with the result of the second verification. Accordingly, in the latch circuit SDL, the control circuit 2 sets the signal SLL to the "H" level to allow the transistor 46 to enter an off-state.

At time t27, the control circuit 2 sets the signal STL to the "H" state to allow the transistor 40 to enter an on-state. In a sense amplifier unit SAU corresponding to the node SEN (1-1) that retains "H"-level data, the bus LBUS retains "L"-level data, and thus the node LAT_S of the latch circuit SDL also retains the "L"-level data. In a sense amplifier unit SAU with respect to the nodes SEN (1-2) and SEN (2) which retain "L"-level data, the bus LBUS retains the "H"-level data, and thus the node LAT_S of the latch circuit SDL also retain the "H"-level data.

At time t28, the control circuit 2 sets the signal STL to the "L" level to allow the transistor 40 to enter an off-state, and sets the signal SLL to the "H" level to allow the transistor 46 to enter an on-state. According to this, the logical data of the latch circuit SDL is determined, and the second verification is terminated.

From time t29 to t30, recovery processing is performed, and the verification operation is terminated.

Furthermore, in the example of FIG. 13 and FIG. 14, the time t1 to time t30 are illustrated with the same interval, but the time interval between the time t1 to time t30 may be different in each case. For example, time from time t1 to t6, for which precharge of the bit line BL is performed, may be set to be longer. In addition, a first sense period (time t6 to t7) is shorter than a second sense period (time t19 to t20).

1.3 With respect to Effect of This Embodiment

According to the configuration of this embodiment, it is possible to improve reliability of the semiconductor memory device. Hereinafter, description will be given of the effect.

During the data read operation (or verification), data (analog data) read out to the node SEN of the sense amplifier unit, the logical level of the "H" level or the "L" level is determined (digitized) when being stored in the latch circuit. Accordingly, where a plurality of the latch circuits retain the data, if a variation exists in a threshold voltage of transistors which constitute the latch circuit, determination of the "H" level or the "L" level may be different depending on the latch circuit that stores the data.

In addition, the threshold voltage of the sense transistor that senses the voltage of the node SEN has a variation for each chip (semiconductor memory device) due to a manufacturing variation or an effect by an operation temperature, an erroneous determination may be made for sense.

Accordingly, in the configuration according to this embodiment, the scan unit SCU includes a static latch circuit. Accordingly, the data, which is read-out to the node SEN, is digitized in the scan unit SCU, and thus it is possible to suppress a variation in the determination of the "H" level or the "L" level by the latch circuit that stores the data. As a result, it is possible to improve reliability of the semiconductor memory device.

In addition, in the configuration according to this embodiment, it is possible to control a substrate bias of the sense transistor. More specifically, it is possible to control a substrate bias of the p-channel MOS transistor 25 in which the node SEN is connected to a gate. Accordingly, it is possible to suppress a variation in the threshold voltage of the sense transistor, and it is possible to suppress an erroneous determination for sense. As a result, it is possible to improve reliability of the semiconductor memory device.

In addition, it is possible to control a substrate bias of the p-channel MOS transistor 24. Hereinafter, this effect will be described. For example, in the transistor 24, the node SEN is connected to a p$^+$-type impurity diffusion layer (a source or a drain), and the node NWSA is connected to an n-type well (back gate). According to this, when a voltage of the node SEN becomes higher than a voltage of the node NWSA, a forward bias voltage occurs from the node SEN to the node NWSA, and thus a current flows. In contrast, in the configuration according to this embodiment, for example, when a voltage higher than the voltage VDDSA is applied to the node SEN due to the clock-up, it is possible to set the substrate bias (node NWSA) of the transistor 24 to be higher than the voltage of the node SEN. Accordingly, in the transistor 24, it is possible to suppress the forward bias voltage from being applied from the source (or the drain) to the substrate (back gate side), and thus it is possible to suppress a current from flowing to the substrate. That is, it is possible to suppress a current from flowing from the node SEN to the substrate. As a result, it is possible to improve reliability of the semiconductor memory device.

In addition, for example, when continuously executing the first verification and the second verification, after termination the "digitizing" in the first verification, the voltage of the node SEN that retains the "H"-level data is set to the voltage VDDSA, and thus it is not necessary to perform the set-up (recharging) of the node SEN again. According to this, it is possible to shorten processing time of the write operation, and thus it is possible to improve processing capability of the semiconductor memory device.

In addition, in the second verification, the precharge is not performed with respect to the bit line BL, which fails in the first verification, and thus it is possible to reduce power consumption of the semiconductor memory device.

In addition, since the scan unit SCU is constituted by the static latch circuit, it is possible to apply a power supply voltage from the scan unit SCU to the bus LBUS (it is possible to drive the bus LBUS). Accordingly, it is not necessary for the LBUS precharge circuit PCC to apply the power supply voltage VDDSA to the bus LBUS as long as the LBUS precharge circuit PCC can apply the ground voltage VSS to the bus LBUS. According to this, it is not necessary to set the "H"-level voltage of the signal LPC to a voltage higher than the power supply voltage VDDSA, and thus it is possible to simplify the voltage generation circuit.

In addition, the node SEN is connected to the gate of the n-channel MOS transistor 18 and the gate of the p-channel MOS transistor 25, and thus it is possible to use either the transistor 18 or the transistor 25 as the sense transistor.

In addition, the plurality of capacitive elements 27 to 29 are connected to the node SEN. According to this, it is possible to increase parasitic capacitance of the node SEN. In addition, it is possible to raise a voltage of the node SEN through selective clock-up of the node SEN, the node CLKDB, and the node CLKCS which are respectively connected to the capacitive elements 27 to 29.

In addition, the capacitive elements 27 to 29 correspond to wiring-to-wiring capacitance or plug-to-plug capacitance. According to this, it is not necessary to add a capacitive element, and thus it is possible suppress an increase in a chip area of the semiconductor memory device.

2. Second Embodiment

Next, a second embodiment will be described. In the second embodiment, description will be given of a method of controlling a voltage value of the node NVSA so as to suppress a variation in a threshold voltage of the sense transistor. Hereinafter, description will be given of only a difference from the first embodiment.

2.1 With Respect Configuration of Sense Amplifier Unit

First, a configuration of the sense amplifier unit SAU will be described with reference to FIG. 15. Hereinafter, description will be given of a difference from FIG. 5 in the first embodiment.

Figure 15:
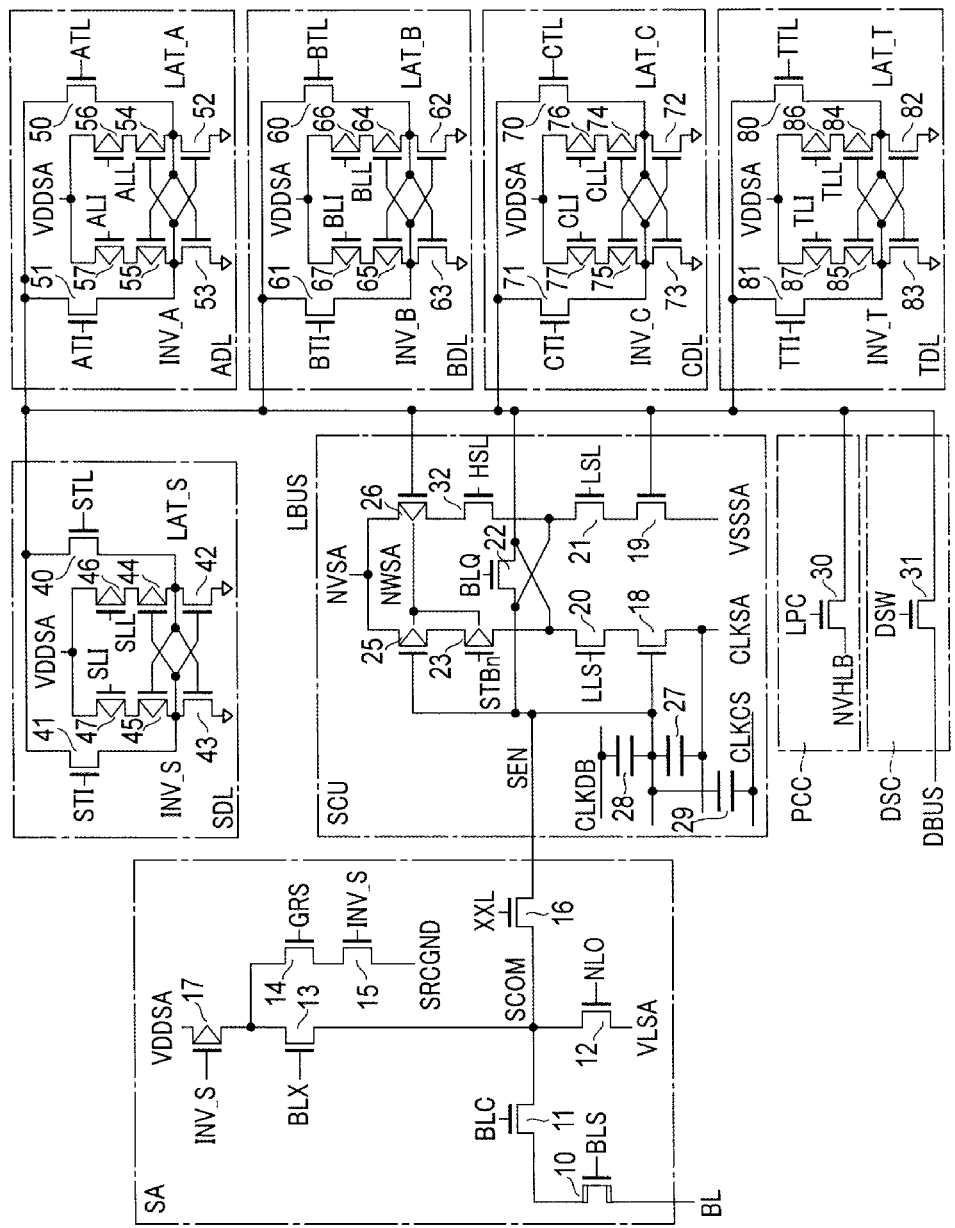
FIG. 15 is a circuit diagram of a sense amplifier unit that is provided in a semiconductor memory device according to a second embodiment.

As illustrated in FIG. 15, in the sense amplifier unit SAU according to this embodiment, the low-breakdown-voltage p-channel MOS transistor 24 in FIG. 5 in the first embodiment is substituted with a low-breakdown-voltage n-channel MOS transistor 32, and a signal HSL is input to a gate of the transistor 32. The other configurations are the same as in FIG. 5.

2.2 With Respect to Voltage of Each Wiring of Sense Amplifier Unit in Verification Next, description will be given of a voltage of each wiring in the sense amplifier unit SAU in the verification with reference to FIG. 16 and FIG. 17. Hereinafter, description will be given of only a difference from FIG. 13 and FIG. 14 in the first embodiment.

Figure 16:
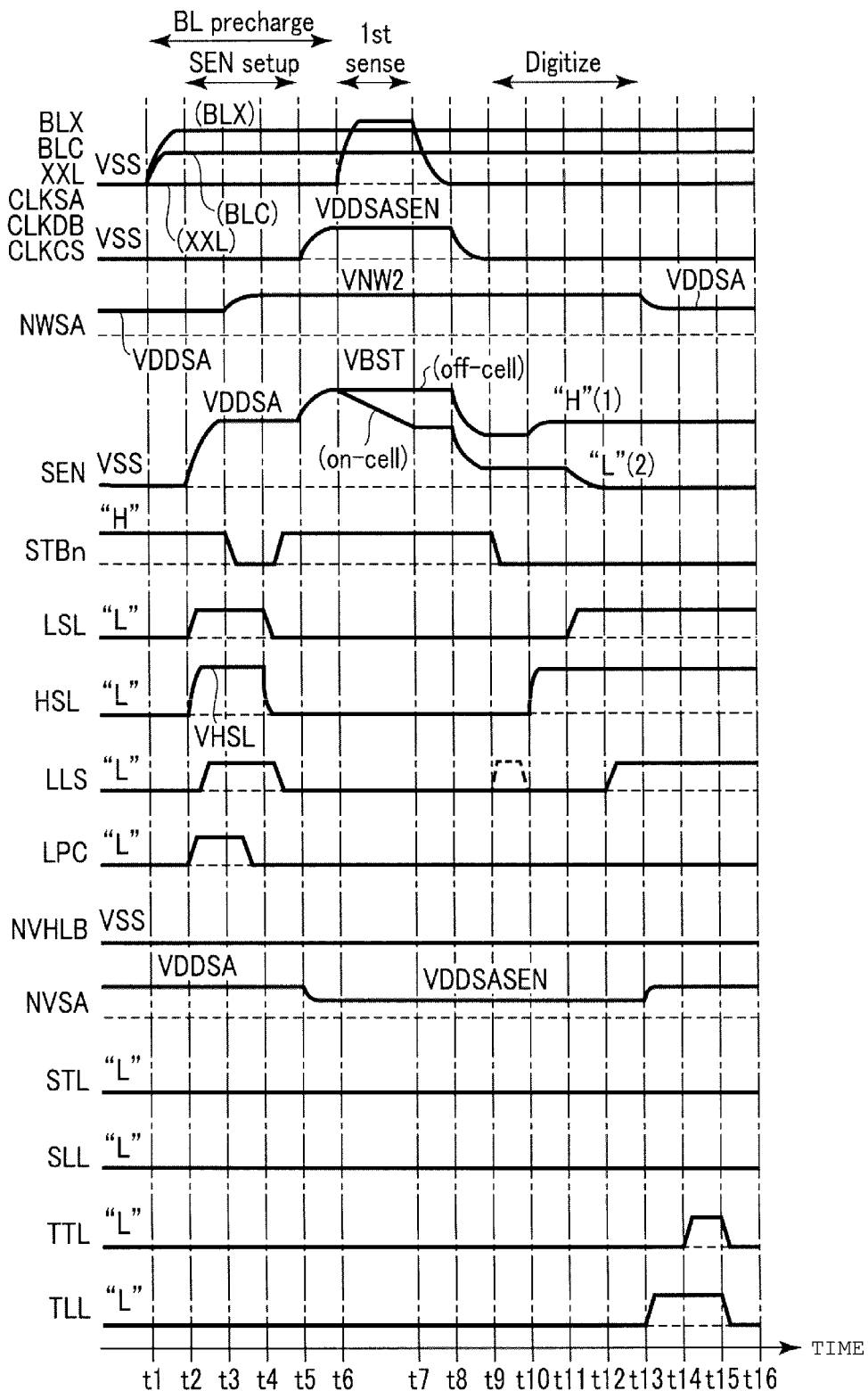
FIG. 16 is a timing chart illustrating a potential of each wiring of the sense amplifier during verification of the semiconductor memory device according to the second embodiment.
Figure 17:
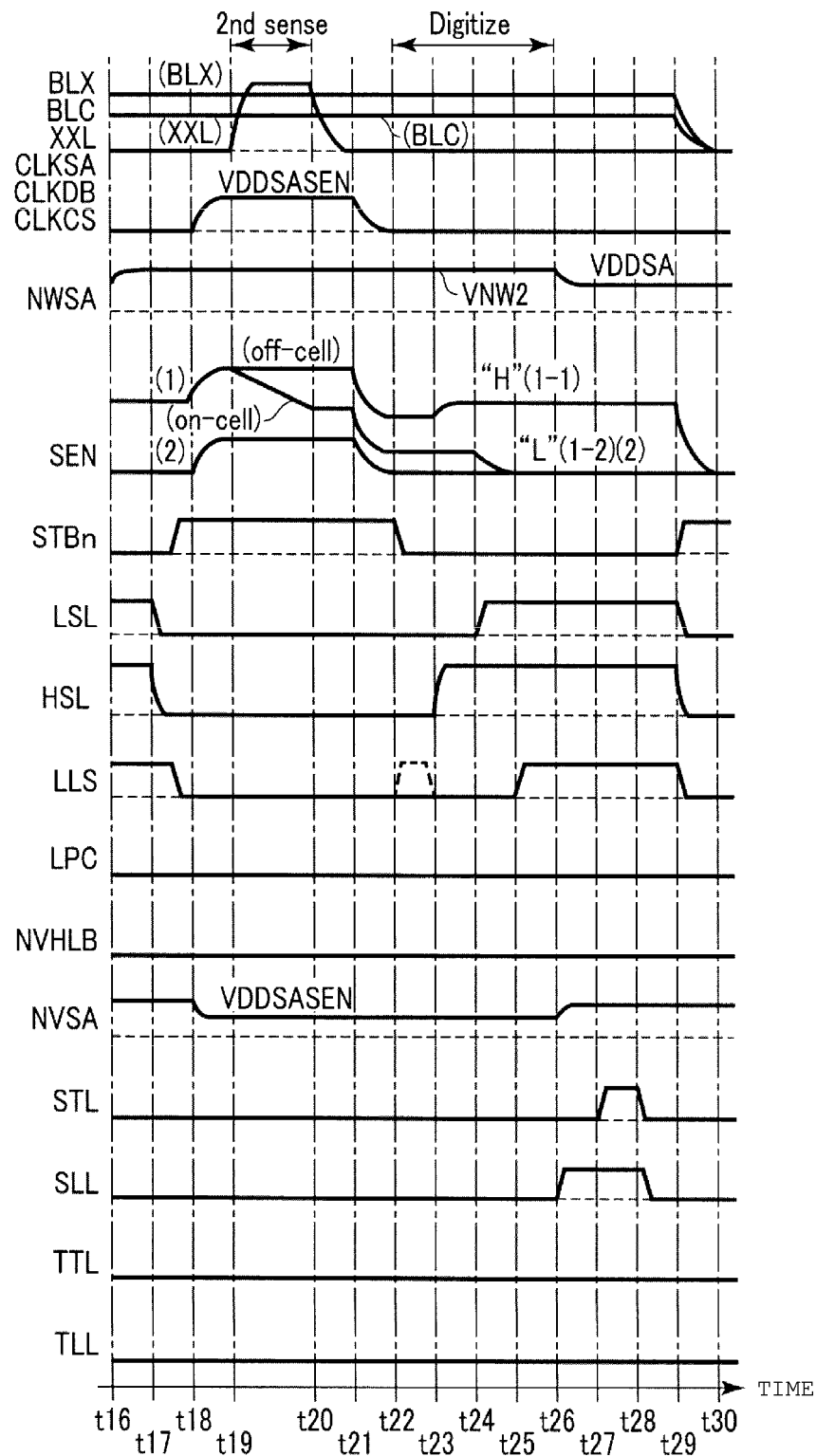
FIG. 17 is a timing chart illustrating a potential of each wiring of the sense amplifier during verification of the semiconductor memory device according to the second embodiment.

As illustrated in FIG. 16, at time t2, the control circuit 2 sets the signal HSL to an "H" level to allow the transistor 32 to enter an on-state. When the "H"-level voltage of the signal HSL is set to VHSL, it is necessary to transfer the voltage VDDSA to the transistor 32, the voltage VHSL satisfy a relationship of VHSL≥"VDDSA+Vt32+" (Vt32 is a threshold voltage of the transistor 32). In addition, the voltage generation circuit 3 applies the voltage VNW2 to the node NWSA. In this embodiment, the transistor 32 is the n-channel MOS transistor, and thus it is not necessary to apply the voltage VNW1 (>VBST) to the node NWSA.

At time t4, the control circuit 2 sets the signal HSL to an "L" level to allow the transistor 32 to enter an off-state.

At time t5, the voltage generation circuit 3 applies a voltage VDDSASEN to the node NVSA. The voltage VDDSASEN is a voltage that is set in accordance with a variation in a threshold voltage of the sense transistor 25. For example, a variation (variation amount) of the threshold voltage of the transistor 25 is set to $\Delta Vt25$, a relationship of VDDSASEN=VDDSA−$\Delta Vt25$.

At time t10, the control circuit 2 sets the signal HSL to the "H" level to allow the transistor 32 to enter an on-state. According to this, in the node SEN (1) corresponding to an off-cell, the logical level of the retention data is determined as the "H" level.

At time t13, the voltage generation circuit 3 applies the voltage VDDSA to the node NVSA. That is, the voltage VDDSASEN is applied to the node NVSA during the first sense and the "digitizing".

As illustrated in FIG. 14, at time t16, the voltage generation circuit 3 applies the voltage VNW2 to the node NWSA.

An operation from time t17 to t26 is substantially the same as the operation from time t4 to t13. However, as is the case with the first embodiment, in the node SEN (2) corresponding to a memory cell transistor MT that becomes an on-cell in the first verification, the second sense is executed in a state in which the retention data is in the "L" level.

2.3 With Respect to Effect According to This Embodiment

According to the configuration of this embodiment, the same effect as in the first embodiment is obtained.

In addition, in the configuration according to this embodiment, it is possible to appropriately control a source voltage value of the sense transistor 25. According to this, it is possible to suppress a variation in the threshold voltage of the sense transistor 25, and it is possible to suppress erroneous determination for sense. As a result, it is possible to improve reliability of the semiconductor memory device.

In addition, the transistor 32, which is included in the scan unit SCU and is connected to the node SEN, is constituted by the n-channel MOS transistor. According to this, it is possible to block a forward bias voltage to an n-type well that is problematic in the p-channel MOS transistor.

3. Third Embodiment

Next, a third embodiment will be described. The third embodiment is different from the first and second embodiments in a configuration of the latch circuit SDL and a configuration in which a scan unit SCU and a bus LBUS of two sense amplifier units SAU are capable of being connected with a wiring other than the bus DBUS. Hereinafter, description will be given of only a difference from the first and second embodiments.

3.1 With Respect to Configuration of Sense Amplifier and Data Latch

Figure 18:
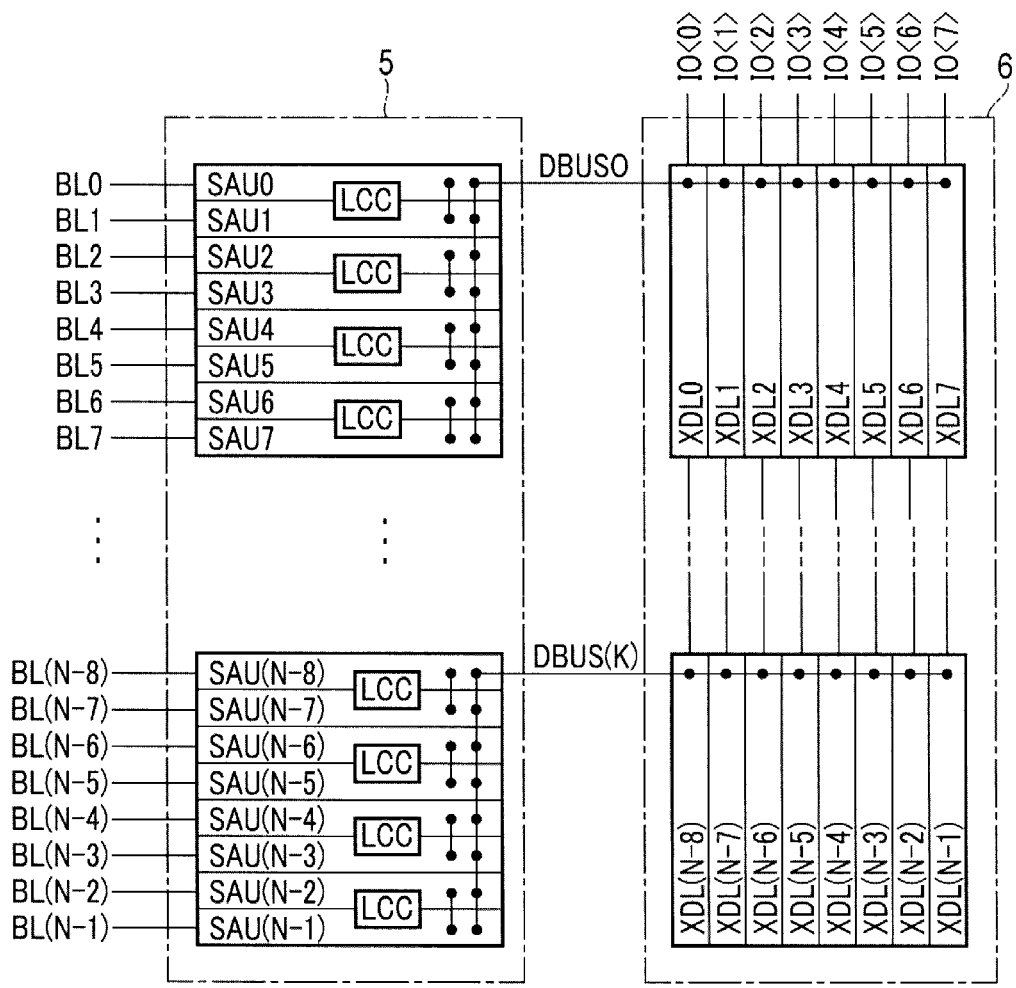
FIG. 18 is a block diagram of a sense amplifier and a data latch which are provided in a semiconductor memory device according to a third embodiment.

First, description will be given of the configuration of the sense amplifier 5 and the data latch 6 with reference to FIG. 18.

As illustrated in the drawing, the sense amplifier 5 includes a plurality of connection circuits LCC. Each of the connection circuits LCC is a circuit that connects two sense amplifier units SAU by using a node other than the bus DBUS as necessary. For example, when operation processing of data (including inversion, an AND operation, an OR operation, and the like of data of the node SEN) is performed in one sense amplifier unit SAU, it is possible to use the other sense amplifier unit SAU through the connection circuit LCC. In an example of FIG. 18, the connection circuit LCC connects an even-numbered sense amplifier unit (for example, SAU0) and an odd-numbered sense amplifier unit (for example, SAU1) to each other. Furthermore, a combination of the sense amplifier units SAU, which are connected to the connection circuit LCC, is arbitrary.

Figure 19:
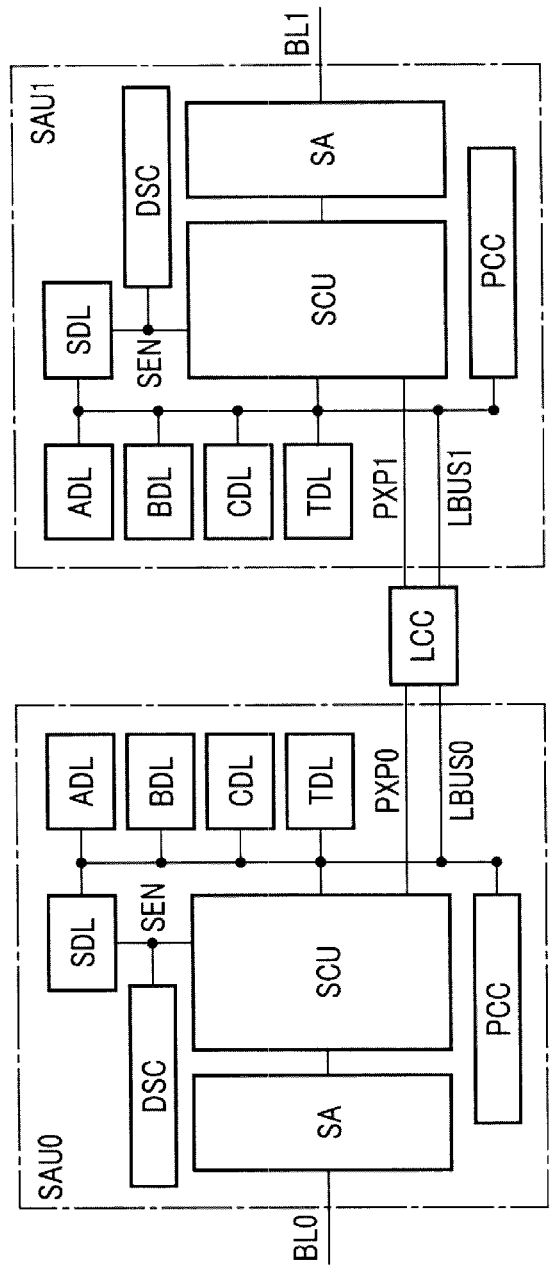
FIG. 19 is a block diagram of the sense amplifier that is provided in the semiconductor memory device according to the third embodiment.

Next, description will be given of details of the configuration of the sense amplifier 5 with reference to FIG. 19. An example of FIG. 19 illustrates the sense amplifier units SAU0 and SAU1, but a set of the other sense amplifier units SAU has the same configuration. In the following description, for example, when a bus LBUS of the sense amplifier unit SAU0 and a bus LBUS of the sense amplifier unit SAU1 are discriminated, the bus LBUS of the sense amplifier unit SAU0 is described as "LBUS0", and the bus LBUS of the sense amplifier unit SAU1 is described as "LBUS1". This is also true for the other nodes and signals. Furthermore, in the following description, description will be made by mainly using the sense amplifier unit SAU0.

As is the case with the first and second embodiments, the sense amplifier unit SAU includes a sense circuit SA, a scan unit SCU, an LBUS precharge circuit PCC, a DBUS switch circuit DSC, latch circuits SDL, ADL, BDL, CDL, and TDL.

In the sense amplifier unit SAU according to this embodiment, the latch circuit SDL is constituted by a latch circuit (hereinafter, referred to as "dynamic latch circuit") that retains data by using a capacitive element. The configuration of the dynamic latch circuit will be described later. According to this, the latch circuit SDL is connected to the scan unit SCU through the bus LBUS and the node SEN. In addition, the DBUS switch circuit DSC is connected to the node SEN.

Scan units SCU of the sense amplifier units SAU0 and SAU1 are connected to a connection circuit LCC through a node PXP0 and a node PXP1, respectively. In addition, a bus LBUS0 of the sense amplifier unit SAU0 and a bus LBUS1 of the sense amplifier unit SAU1 are connected to the connection circuit LCC.

3.2 With Respect to Circuit Configuration of Sense Amplifier Unit and Connection Circuit.

Next, description will be given of a circuit configuration of the sense amplifier unit SAU and the connection circuit LCC with reference to FIG. 20. In an example of FIG. 20, in the sense amplifier unit SAU0, the sense circuit SA, the DBUS switch circuit DSC, the LBUS precharge circuit PCC, and the latch circuits ADL, BDL, CDL, and TDL, which have the same configuration as in the first and second embodiments, are indicated by a block for simplification of explanation, and circuit diagrams thereof are omitted. In addition, in the sense amplifier unit SAU1, only the scan unit SCU is illustrated, and the other circuits are omitted.

Figure 20:
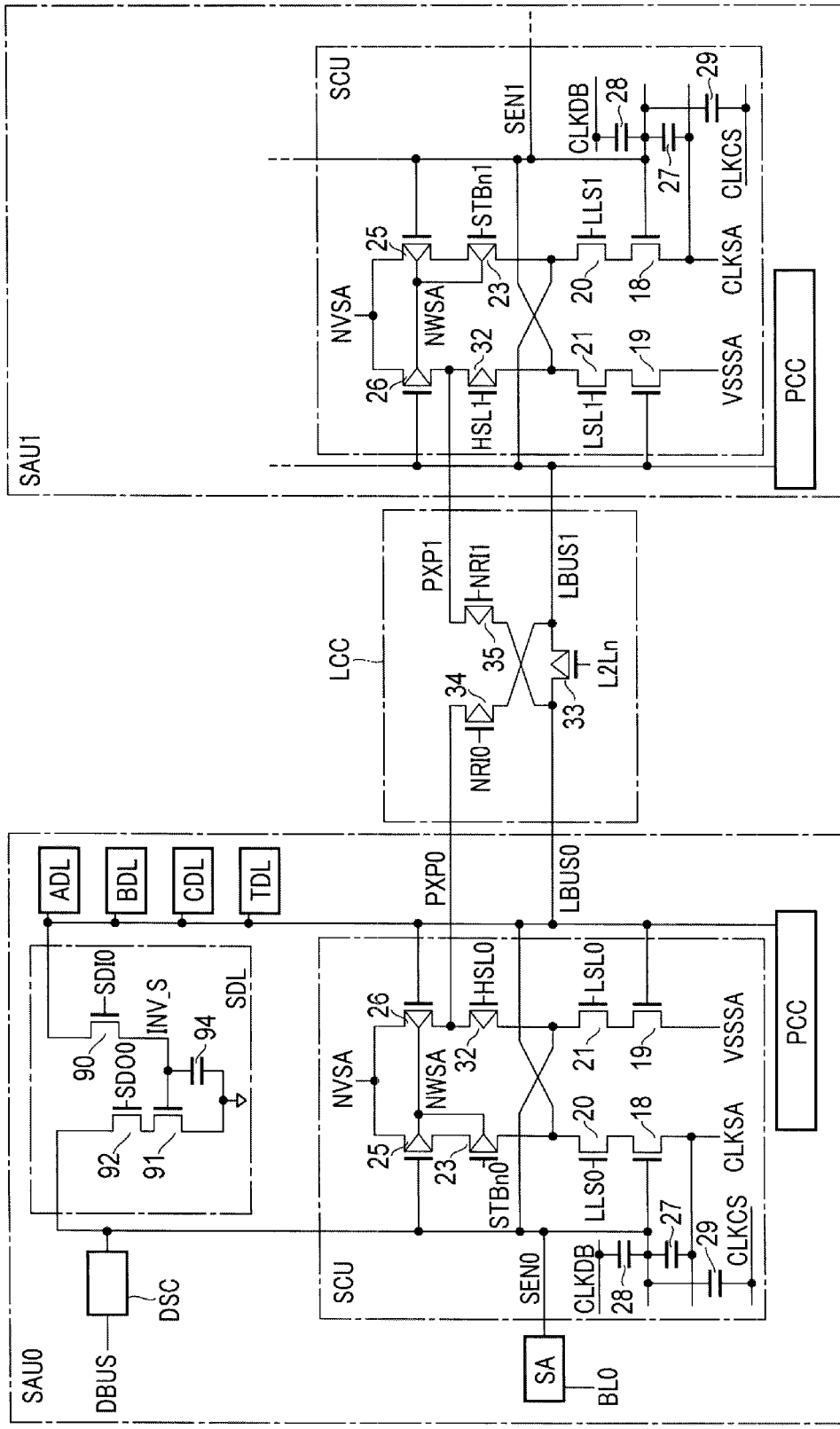
FIG. 20 is a circuit diagram of a sense amplifier unit and a connection circuit which are provided in the semiconductor memory device according to the third embodiment.

As illustrated in FIG. 20, as is the case with the second embodiment, the scan unit SCU in this embodiment includes the n-channel MOS transistor 32 that is connected to the node SEN. In addition, differently from the first and second embodiments, the transistor 22, which connects the node SEN and the bus LBUS, is not included.

The latch circuit SDL includes low-breakdown-voltage n-channel MOS transistors 90 to 92, and a capacitive element 94.

In the transistor 90, a signal SDI (SDI0) is input to a gate, one end of a current path is connected to the bus LBUS (LBUS0), and the other end of the current path is connected to a node INV_S.

In the transistor 91, a gate is connected to the node INV_S, one end (source) of a current path is grounded (is connected to a ground voltage wiring to which a voltage VSS is applied), and the other end (drain) of the current path is connected to one end of a current path of the transistor 92.

In the transistor 92, s signal SDO (SDO0) is input to a gate, and the other end of the current path is connected to the node SEN (SEN0).

For example, the capacitive element 94 corresponds to wiring-to-wiring capacitance between the node INV_S and the ground voltage wiring to which the voltage VSS is applied. The capacitive element 94 retains "H"-level data or "L"-level data of the node INV_S. Furthermore, a capacitive element including an upper electrode and a lower electrode may be provided separately from the node INV_S and the ground voltage wiring without using the wiring-to-wiring capacitance, and the upper electrode may be connected to the node INV_S, and the lower electrode may be grounded.

The latch circuit SDL retains data, which is input from the bus LBUS through the transistor 90, in the capacitive element 94, and outputs the data to the node SEN (SEN0) through the transistor 92.

The connection circuit LCC includes low-breakdown-voltage p-channel MOS transistors 33 to 35.

In the transistor 33, a signal L2Ln is input to a gate, one end of a current path is connected to the bus LBUS0 of the sense amplifier unit SAU0 and one end of a current path of the transistor 35, and the other end of the current path is connected to the bus LBUS1 of the sense amplifier unit SAU1 and one end of a current path of the transistor 34.

In the transistor 34, a signal NRI0 is input to a gate, and the other end of the current path is connected to the node PXP0. The node PXP0 is connected to one end of a current path of a transistor 26 of the sense amplifier unit SAU0, and the other end of a current path of a transistor 32.

In the transistor 35, a signal NRI1 is input to a gate, and the other end of the current path is connected to the node PXP1. The node PXP1 is connected to one end of the current path of the transistor 26 of the sense amplifier unit SAU1 and the other end of the current path of the transistor 32.

That is, the connection circuit LCC connects the node PXP0 of the sense amplifier unit SAU0 and the bus LBUS1 of the sense amplifier unit SAU1, and connects the bus LBUS0 of the sense amplifier unit SAU0 and the node PXP1 of the sense amplifier unit SAU1 (hereinafter, the connection as described above is referred to as "cross couple connection".

Furthermore, the transistors 33 to 35 of the connection circuit LCC may be substituted with a low-breakdown-voltage n-channel MOS transistor.

Figure 21:
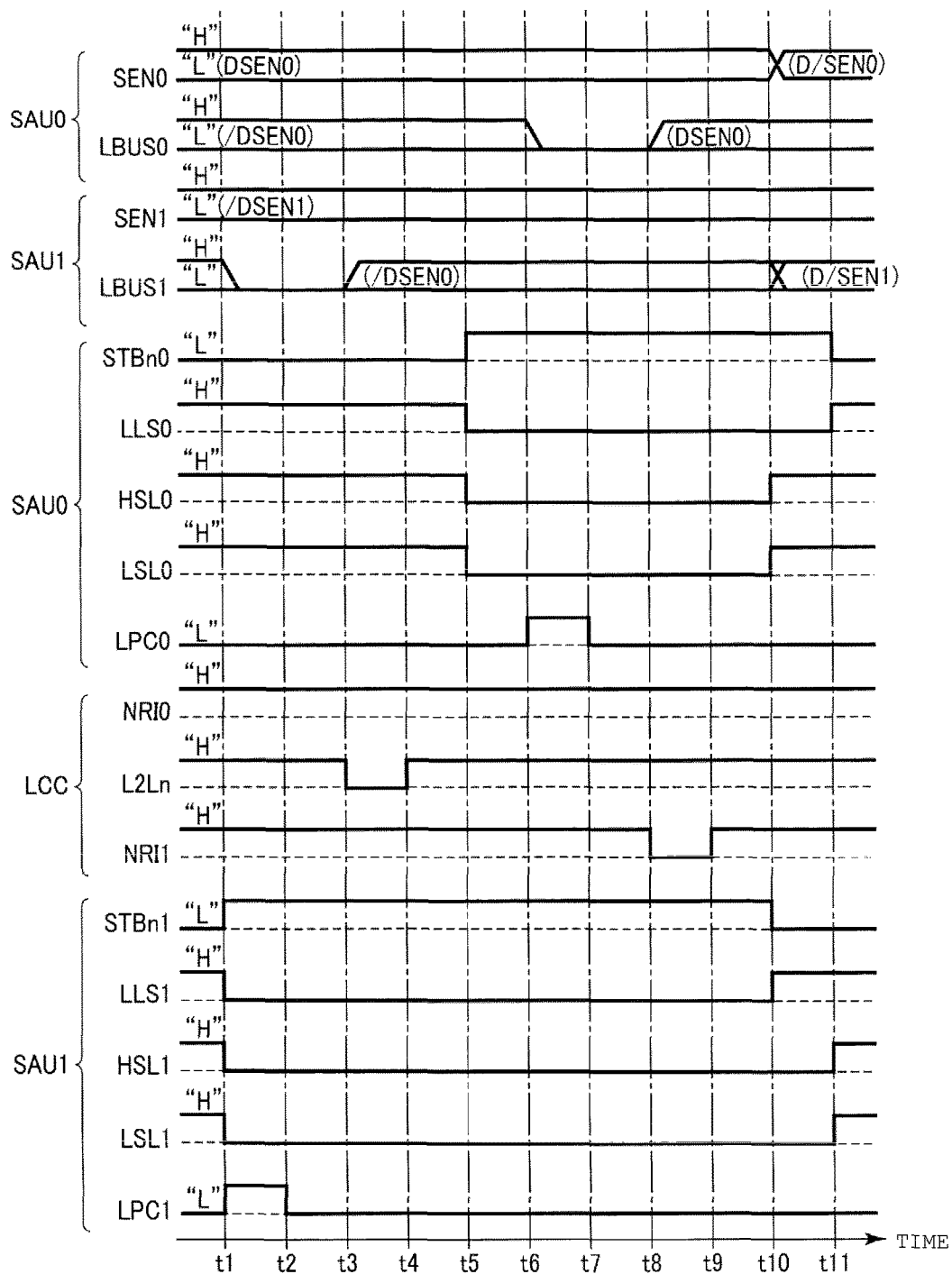
FIG. 21 is a timing chart illustrating a potential of each wiring of the sense amplifier when inverting retention data of a node in the sense amplifier that is provided in the semiconductor memory device according to the third embodiment.

3.3 With Respect to Voltage of Each Wiring in Case of Inverting Data of Node SEN Next, description will be given of a voltage of each wiring in a case of inverting retention data of the node SEN with reference to FIG. 21 as an example of a case of using the connection circuit LCC. FIG. 21 is a timing chart illustrating a voltage of each wiring of the sense amplifier units SAU0 and SAU1, and the connection circuit LCC. An example of FIG. 21 illustrates a case of inverting the retention data of the node SEN of the sense amplifier unit SAU0 by using the connection circuit LCC and the sense amplifier unit SAU1.

In the example of FIG. 21, for discrimination between the sense amplifier unit SAU0 and the sense amplifier unit SAU1, the node SEN, the bus LBUS, the signals STBn, LLS, HSL, LSL, and LPC in the sense amplifier unit SAU0 are noted as a node SEN0, a bus LBUS0, and signals STBn0, LLS0, HSL0, LSL0, and LPC0, respectively. In addition, the node SEN, the bus LBUS, the signals STBn, LLS, HSL, LSL, and LPC in the sense amplifier unit SAU1 are noted as a node SEN1, a bus LBUS1, and signals STBn1, LLS1, HSL1, LSL1, and LPC1, respectively. In addition, data, which is retained by the node SEN0 at an initial state is set as data DSEN0, and data retained by the node SEN1 is set as data DSEN1.

As illustrated in FIG. 21, first, at time t1, the node SEN0 retains "H" (or "L")-level data DSEN0, and the bus LBUS0 retains data /DSEN0 inverted from the data DSEN0. Similarly, the node SEN1 retains H" (or "L")-level data DSEN1, and the bus LBUS1 retains data /DSEN1 inverted from the data DSEN1. The control circuit 2 sets the signal STBn1 to an "H" level, and sets the signals LLS1, HSL1, and LSL1 to an "L" level so as to allow the transistors 20, 21, 23, and 32 in the sense amplifier unit SAU1 to enter an off-state. According to this, the node SEN1 retains the data DSEN1 regardless of a state of the bus LBUS1.

In this state, the control circuit 2 sets the signal LPC1 to the "H" level to allow the transistor 30 in the sense amplifier unit SAU1 to enter an on-state, and applies the voltage VSS to the bus LBUS1. That is, the control circuit 2 sets the bus LBUS1 to the "L" level.

At time t2, the control circuit 2 sets the signal LPC1 to the "L" level to allow the transistor 30 in the sense amplifier unit SAU1 to enter an off-state.

At time t3, the control circuit 2 sets the signal L2Ln of the connection circuit LCC to the "L" level to allow the transistor 33 to enter an on-state. According to this, the data /DSEN0 of the bus LBUS0 is transfer to the bus LBUS1. That is, the bus LBUS1 retains the data /DSEN0.

At time t4, the control circuit 2 sets the signal L2Ln to the "H" level to allow the transistor 33 to enter an off-state.

At time t5, the control circuit 2 set the signal STBn0 to the "H" level, and sets the signals LLS0, HSL0, and LSL0 to the "L" level so as to allow the transistors 20, 21, 23, and 32 in the sense amplifier unit SAU0 to enter an off-state. According to this, the node SEN0 retains the data DSEN0 regardless of the state of the bus LBUS0.

At time t6, the control circuit 2 sets the signal LPC0 to the "H" level to allow the transistor 30 in the sense amplifier unit SAU0 to enter an on-state, and applies the voltage VSS to the bus LBUS0. That is, the control circuit 2 sets the bus LBUS0 to the "L" level.

At time t7, the control circuit 2 sets the signal LPC0 to the "L" level to allow the transistor 30 in the sense amplifier unit SAU0 to enter an off-state.

At time t8, the control circuit 2 sets the signal NRI1 to the "L" level to allow the transistor 35 to enter an on-state. According to this, inverted data of the bus LBUS1, that is, data DSEN0 is transferred to the bus LBUS0. More specifically, when the data DSEN0 is in the "H" level, the data /DSEN0 retained by the bus LBUS1 becomes the "L" level. In this case, the transistor 26 in the sense amplifier unit SAU1 enters an on-state, and the node PXP1 becomes the "H" level (voltage VDDSA is applied to the node PXP1). Accordingly, the bus LBUS0 becomes the "H" level. On the other hand, when the data DSEN0 is in the "L" level, the data DSEN0 retained by the bus LBUS1 becomes the "H" level. In this case, the transistor 26 in the sense amplifier unit SAU1 enters an off-state, and the node PXP1 becomes the "L" level. Accordingly, the bus LBUS0 becomes the "L" level.

At time t9, the control circuit 2 sets the signal NRI1 to the "H" level to allow the transistor 35 to enter an on-state.

At time t10, the control circuit 2 sets the signals HSL0 and LSL0 to the "H" level to allow the transistors 21 and 32 in the sense amplifier unit SAU0 to enter an on-state. According to this, inverted data /DSEN0 of the bus LBUS0 is transferred to the node SEN0. That is, data, which is retained by the node SEN0 at an initial state, is inverted.

In addition, the control circuit 2 sets the signal STBn1 to the "L" level and sets the signal LLS1 to the "H" level to allow the transistors 20 and 23 in the sense amplifier unit SAU1 to enter an on-state. According to this, the data /DSEN1 inverted from the retention data DSEN1 of the node SEN1 is transferred to the bus LBUS1.

At time t11, the control circuit 2 sets the signal STBn0 to the "L" level and sets the signal LLS0 to the "H" level to allow the transistors 20 and 23 in the sense amplifier unit SAU0 to enter an on-state. According to this, the retention data of the node SEN0 and the bus LBUS0 is logically determined.

In addition, the control circuit 2 sets the signals HSL1 and LSL1 to the "H" level to allow the transistors 21 and 32 in the sense amplifier unit SAU1 to enter an on-state. According to this, the retention data of the node SEN1 and the bus LBUS1 is logically determined. Accordingly, the node SEN1 and the bus LBUS1 retain the data in the initial state.

Furthermore, in the example of FIG. 21, time t1 to time t11 are illustrated with the same interval, but the time interval between the time t1 to time t11 may be different in each case.

Figure 22:
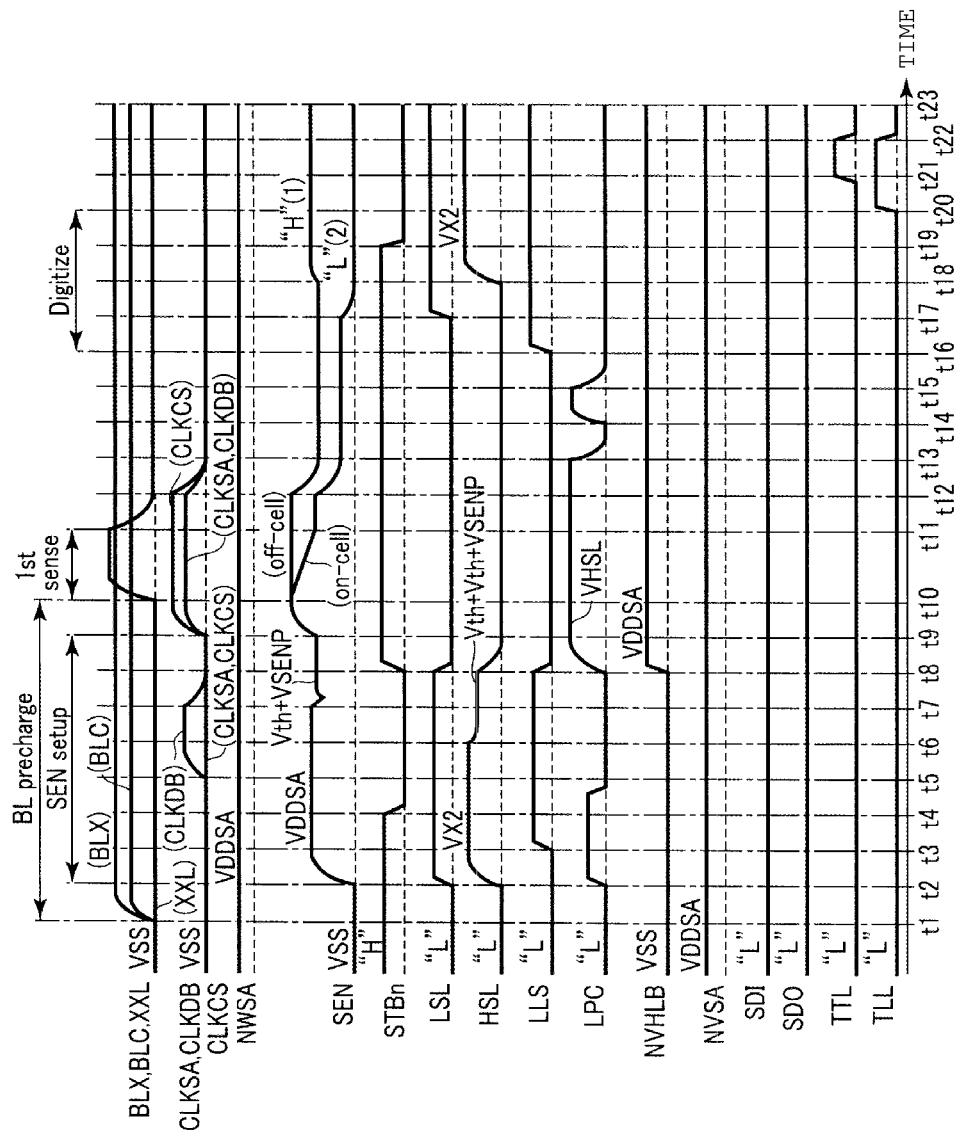
FIG. 22 is a timing chart illustrating a potential of each wiring of the sense amplifier during verification of the semiconductor memory device according to the third embodiment.
Figure 23:
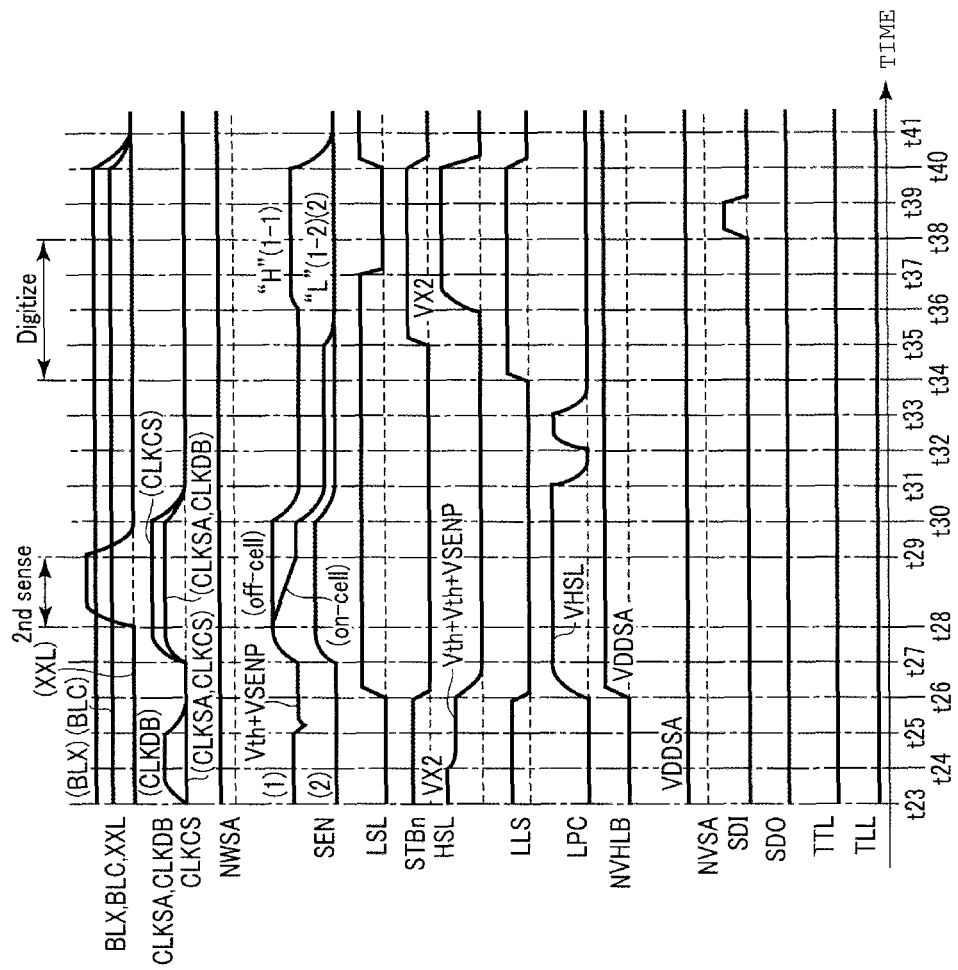
FIG. 23 is a timing chart illustrating a potential of each wiring of the sense amplifier during verification of the semiconductor memory device according to the third embodiment.

3.4 With Regard to Voltage of Each Wiring of Sense Amplifier Unit in Verification Next, description will be given of a voltage of each wiring in the sense amplifier unit SAU in verification with reference to FIG. 22 and FIG. 23. An example of FIG. 22 and FIG. 23 illustrates a continuous timing chart when executing the first verification and the second verification. The first verification is executed from time t1 to t23 in FIG. 22, and the second verification is executed from time t23 to t41 in FIG. 23. The example in FIG. 22 and FIG. 23 illustrates a case where the n-channel MOS transistor 18 is used as a sense transistor. Furthermore, as is the case with the first and second embodiments, the p-channel MOS transistor 25 may be used as the sense transistor. Furthermore, in FIG. 22 and FIG. 23, with regard to respective reference numerals, a number, which is attached to the end of the reference numerals so as to indicate a specific sense amplifier unit SAU, is omitted. For example, notation is made as "SEN" instead of "SEN0". This is also true for the following description.

First, the first verification will be described. As illustrated in FIG. 22, at time t1, as is the case with t1 of FIG. 13, the control circuit 2 sets the signals BLC and BLX to the "H" level. According to this, precharge of the bit line BL is initiated. The precharge of the bit line BL is performed from time t1 to t10.

At time t2, the control circuit 2 sets the signal LPC to the "H" level to allow the transistor 30 to enter an on-state. According to this, the voltage VSS is applied to the bus LBUS, and the bus LBUS becomes the "L" level. The control circuit 2 sets the signal HSL to the "H" level to allow the transistor 32 to enter an on-state. An "H"-level voltage of the signal HSL at this time is set as VX2. The voltage VX2 and the voltage VDDSA satisfy a relationship of VX2≥(VDDSA+Vt32). In addition, the control circuit 2 sets the signal LSL to the "H" level to allow the transistor 21 to enter an on-state. According to this, the voltage VDDSA is applied to the node SEN.

At time t3, the control circuit 2 sets the signal LLS to the "H" level to allow the transistor 20 to enter an on-state.

At time t4, the control circuit 2 sets the signal STBn to the "L" level to allow the transistor 23 to enter an on-state. Then, from time t4 to t5, the control circuit 2 sets the signal LPC to the "L" level to allow the transistor 30 to enter an off-state. According to this, the logical level of the retention data of the node SEN is determined.

At time t5, the voltage generation circuit 3 applies the voltage VDDSA to the node CLKDB. For example, the node SEN and the node CLKDB are connected to each other, and the same voltage VDDSA is supplied thereto. Furthermore, a node, to which the voltage VDDSA is applied, may be the node CLKSA or the node CLKCS without limitation to the node CLKDB. In addition, as a node to which the voltage VDDSA is applied, two or more nodes may be selected instead of one node. At this time, the potential of the node SEN is maintained to the voltage VDDSA because the transistor 32 is in the on-state.

At time t6, the control circuit 2 sets the "H"-level voltage of the signal HSL to "Vt32+Vt32+VSENP". The voltage VSENP is a set-up voltage of the node SEN when using the n-channel MOS transistor 18 as the sense transistor, and is set in accordance with the threshold voltage of the transistor 18. The voltage VSENP is a voltage that is lower than the voltage VDDSA.

At time t7, the voltage generation circuit 3 applies the voltage VSS to the node CLKDB. At this time, a voltage of the node SEN slightly lowers due to an effect of clock-down of the node CLKDB. However, since the transistor 32 is in the on-state, the voltage is charged again to "Vt32+VSENP" that is clamped by the signal HSL.

At time t8, the voltage generation circuit 3 applies the voltage VDDSA to the node NVHLB. The control circuit 2 sets the signal STBn to the "H" level and sets the signals LSL, HSL, and LLS to the "L" level to allow the transistors 20, 21, 23, and 32 to enter an off-state. In addition, the control circuit 2 sets the signal LPC to the "H" level to allow the transistor 30 to enter an on-state. At this time, for example, the voltage VHSL is applied to the gate of the transistor 30 as an "H"-level voltage of the signal LPC. As a result, the transistor 30 enters an on-state, and the voltage VDDSA is applied to the bus LBUS through the node NVHLB.

At time t9, the voltage generation circuit 3 applies the voltage VDDSA to the node CLKSA and the node CLKDB, and applies, for example, a voltage VCB higher than the voltage VDDSA to the node CLKCS. The voltage VCB is a voltage that is applied to the node CLKCS to raise (boost) the voltage of the node SEN to a voltage that is required. The voltage VCB is set in accordance with capacitance (plug-to-plug capacitance) of the capacitive element 28. As a result, the capacitive elements 27 to 29 are charged, and the voltage of the node SEN rises.

From time t10 to t11, the control circuit 2 executes the first sense. Specifically, from time t10 to t11, the control circuit 2 sets the signal XXL to the "H" level to allow the transistor 16 to enter an on-state. A voltage of a node SEN corresponding to an off-cell hardly varies, and a voltage of a node SEN corresponding to an on-cell lowers.

At time t12, the voltage generation circuit 3 applies the voltage VSS to the node CLKSA, the node CLKDB, and the node CLKCS. As a result, the voltage of the node SEN lowers due to an effect of capacitive coupling.

At time t13, the control circuit 2 sets the signal LPC to the "L" level to allow the transistor 30 to enter an off-state.

At time t14, the control circuit 2 sets the signal LPC to the "H" level to allow the transistor 30 to enter an on-state, and charges the bus LBUS again with the voltage VDDSA.

At time t15, the control circuit 2 sets the signal LPC to the "L" level to allow the transistor 30 to enter an off-state. Furthermore, the off/on operation of the signal LPC from time t13 to t15 may be omitted. That is, the bus LBUS may be continuously charged until reaching the time t15.

At time t16, the control circuit 2 sets the signal LLS to the "H" level to allow the transistor 20 to enter an on-state. When the sense transistor 18 is in the off-state (when the sense transistor 18 is an on-cell), the voltage VDDSA applied to the bus LBUS is maintained. On the other hand, when the sense transistor 18 is in the on-state (when the sense transistor 18 is an off-cell), the voltage VSS is applied to the bus LBUS. That is, "H"-level data is retained in a bus LBUS corresponding to an on-cell, and "L"-level data is retained in a bus LBUS corresponding to an off-cell.

At time t17, the control circuit 2 sets the signal LSL to the "H" level to allow the transistor 21 to enter an on-state. When the bus LBUS retains the "H"-level data, the transistor 19 enters an on-state, and thus the voltage VSS is applied to the node SEN. That is, when the bus LBUS retains the "H"-level data, the logical level of the retention data of the node SEN is determined to be the "L" level (2).

At time t18, the control circuit 2 sets the signal HSL to the "H" level, and applies the voltage VX2 to the gate of the transistor 32. According to this, the transistor 32 enters an on-state. When the bus LBUS retains "L"-level data, the transistor 26 enters an on-state, and thus the voltage VDDSA is applied to the node SEN. That is, when the bus LBUS retains the "L"-level data, the logical level of the retention data of the node SEN is determined to be the "H" level (1). According to this the logical level of the retention data of the node SEN is determined. That is, from time t16 to t20, the "digitizing" of the node SEN is executed.

From time t20 to t23, the control circuit 2 updates the latch circuit TDL in accordance with the first verification result similar to from time t13 to t16 in FIG. 13.

Next, the second verification will be described. As illustrated in FIG. 23, an operation from time t23 to t38 is substantially the same as the operation from time t5 to t20. The second sense is executed from time t28 to t29, and the "digitizing" is executed from time t34 to t38. In the second verification, a node SEN (2) corresponding to a memory cell transistor MT, which becomes an on-cell in the first verification, is subjected to the second sense in a state in which the retention data is in the "L" level. Accordingly, from a result of the second verification, a node SEN (1-1) corresponding to a memory cell transistor MT, which becomes an off-cell in the first verification and the second verification, retains "H"-level data. A node SEN (1-2) corresponding to the memory cell transistor MT, which becomes an off-cell in the first verification and becomes an on-cell in the second verification, retains "L"-level data similar to the node SEN (2) corresponding to the memory cell transistor MT that becomes an on-cell in the first verification.

From time t38 to t39, the control circuit 2 sets the signal SDI to the "H" level to allow the transistor 90 to enter an on-state. According to this, data (inverted data of the node SEN) of the bus LBUS is stored in the latch circuit SDL. More specifically, when the bus LBUS retains the "H"-level data, the capacitive element 94 is charged, and the node INV_S retains the "H"-level data. When the bus LBUS retains "L"-level data, the capacitive element 94 is discharged, and the node INV_S retains the "L"-level data.

From time t40 to t41, recovery processing is performed, and the verification operation is terminated.

Furthermore, in the example of FIG. 22 and FIG. 23, time t1 to time t41 are illustrated with the same interval, but the time interval between the time t1 to time t41 may be different in each case similar to the first and second embodiments.

3.5 With Respect to Effect of This Embodiment

According to the configuration of this embodiment, the same effect as in the first and second embodiments is obtained.

In addition, in the configuration according to this embodiment, since the latch circuit SDL is constituted by a dynamic latch circuit, it is possible to further reduce the number of elements which constitute the latch circuit in comparison to the static latch circuit. As a result, it is possible to suppress an increase in a chip area of the semiconductor memory device.

In addition, in the configuration according to this embodiment, the connection circuit LCC is provided for cross couple connection between the bus LBUS of the two sense amplifier units SAU and the node PXP. According to this, it is possible to execute data operation processing (for example, data inversion of the node SEN) in the sense amplifier unit SAU on one side by using the connection circuit LCC and the sense amplifier unit SAU on the other side. Accordingly, in the sense amplifier unit SAU, it is possible to reduce the number of latch circuits which are required. As a result, it is possible to suppress an increase in a chip area of the semiconductor memory device.

4. Fourth Embodiment

Next, a fourth embodiment will be described. The fourth embodiment is different from the third embodiment in the configuration of the LBUS precharge circuit PCC and the connection circuit LCC. Hereinafter, description will be given of only a difference from the third embodiment.

4.1 With Respect to Configuration of Sense Amplifier Unit and Connection Circuit First, description will be given of the configuration of the sense amplifier unit SAU and the connection circuit LCC with reference to FIG. 24. In an example of FIG. 24, the sense circuit SA, the DBUS switch circuit DSC, and the latch circuits ADL, BDL, CDL, and TDL, which have the same circuit configuration as in the first to third embodiments, are indicated by a block for simplification of explanation. The sense amplifier unit SAU1 that is connected to the connection circuit LCC is omitted. In addition, circuit configurations of the scan unit SCU and the latch circuit SDL are the same as in FIG. 20 of the third embodiment, and thus description thereof will be omitted.

Figure 24:
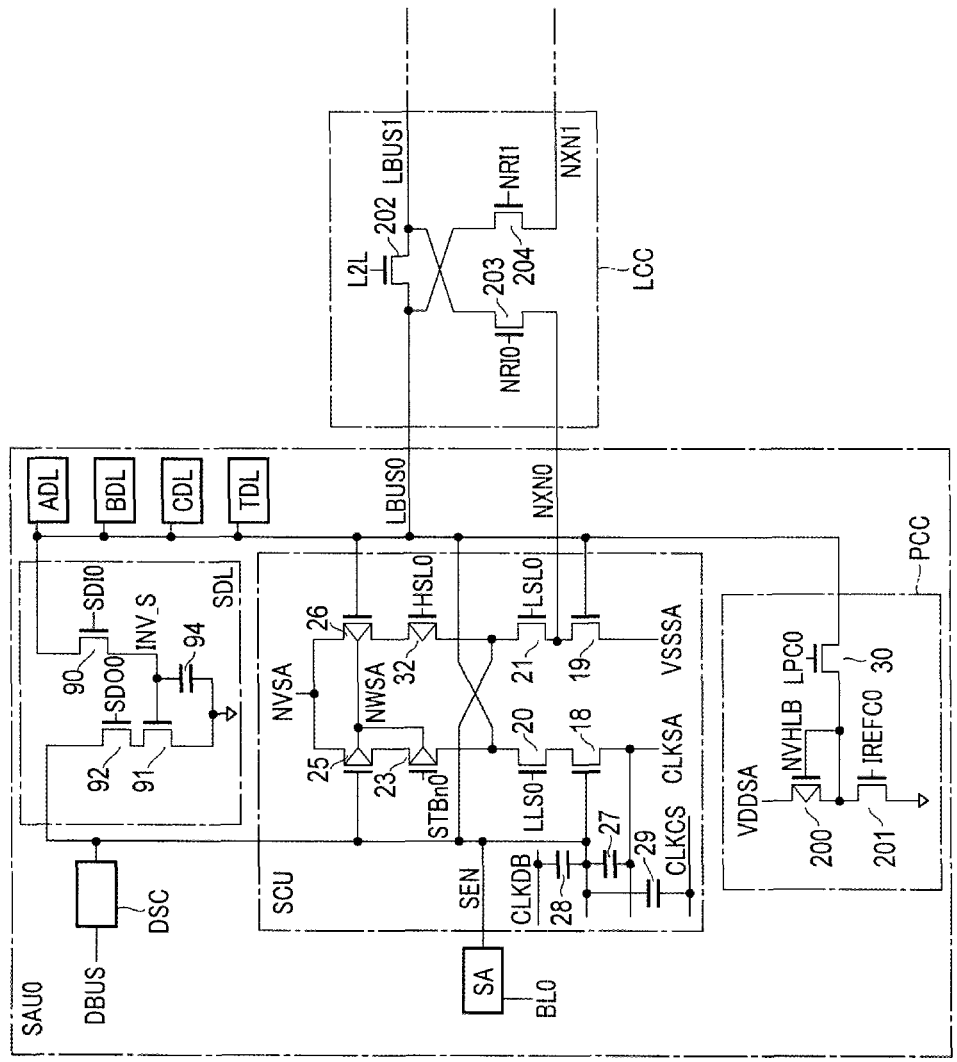
FIG. 24 is a circuit diagram of a sense amplifier unit and a connection circuit which are provided in a semiconductor memory device according to a fourth embodiment.

As illustrated in FIG. 24, the LBUS precharge circuit PCC includes low-breakdown-voltage n-channel MOS transistors 30 and 201, and a low-breakdown-voltage p-channel MOS transistor 200.

In the transistor 30, a signal LPC (LPC0) is input to a gate, and one end of a current path is connected to the bus LBUS, and the other end of the current path is connected to the node NVHLB.

In the transistor 201, a signal IREFC (IREFC0) is input to a gate, one end (drain) of a current path is connected to the node NVHLB, and the other end (source) of the current path is grounded. The signal IREFC is a signal that controls a current flowing to the bit line BL when a voltage is applied to the bit line, and a current that is clamped by the signal IREFC flows through the transistor 201.

In the transistor 200, the voltage VDDSA is applied to one end (source) of a current path, and a gate and the other end (drain) of the current path are connected to the node NVHLB. That is, the transistor 200 is diode-connected. The transistor 200 constitutes a current mirror with the transistor 17 in the sense circuit SA. More specifically, when the transistors 30 and 90 are in an on-state, the gate of the transistor 200 is connected to the gate of the transistor 17 through the node NVHLB, the bus LBUS, and the node INV_S. Accordingly, when controlling a current that flows to the transistor 200 by using the transistor 201, it is possible to control a current that flows to the bit line BL through the transistor 17.

Furthermore, the transistors 200 and 201 are used when controlling a current that flows to the bit line BL. For example, when the voltage VDDSA or the voltage VSS is applied to the node NVHLB, the voltage VDDSA or the voltage VSS is applied to the node NVHLB through a selector circuit (not illustrated).

The connection circuit LCC in this embodiment includes low-breakdown-voltage n-channel MOS transistors 202 to 204.

In the transistor 202, a signal L2L is input to a gate, one end of a current path is connected to the bus LBUS0 of the sense amplifier unit SAU0 and one end of a current path of the transistor 204, the other end of the current path is connected to the bus LBUS1 of the sense amplifier unit SAU1 and one end of a current path of the transistor 203.

In the transistor 203, a signal NRI0 is input to a gate, and the other end of the current path is connected to a node NXN0. The node NXN0 is connected to the one end of the current path of the transistor 21 of the sense amplifier unit SAU0 and the other end of the current path of the transistor 19.

In the transistor 204, a signal NRI1 is input to a gate, and the other end of the current path is connected to a node NXN1. The node NXN1 is connected to the one end of the current path of the transistor 21 of the sense amplifier unit SAU1, and the other end of the current path of the transistor 19.

That is, the connection circuit LCC in this embodiment connects the node NXN0 of the sense amplifier unit SAU0 and the bus LBUS1 of the sense amplifier unit SAU1, and establishes a cross couple connection between the bus LBUS0 of the sense amplifier unit SAU0 and the node NXN1 of the sense amplifier unit SAU1.

4.2 With Respect to Effect of This Embodiment

According to the configuration of this embodiment, the same effect as in the third embodiment is obtained.

In addition, in the configuration according to this embodiment, when the sense amplifier 5 charges the bit line BL, it is possible to control a current that flows to the bit line BL. The effect of this embodiment will be described in detail.

For example, in the verification operation, a cell current, which is two or more times a cell current (current flowing through a memory cell transistor MT that is a target) required for determination of an on-cell, may flow depending on characteristics of the memory cell transistor MT, and thus power consumption may increase. In contrast, in the configuration according to this embodiment, it is possible to control a current that flows to the bit line BL, that is, a cell current. As a result, it is possible to suppress an increase in power consumption.

4. Modification Example, and the Like

The semiconductor memory device according to the above-described embodiments includes a first memory cell (MT0@ in FIG. 2), a first bit line (BL0@ in FIG. 2) that is connected to the first memory cell, and a first sense amplifier (SAU0@ in FIG. 4) that is connected to the first bit line. The first sense amplifier includes a first node (SEN@ in FIG. 5) from which charges are transferred to the first bit line in accordance with data of the first memory cell, a first capacitive element (27@ in FIG. 5) that is connected to the first node, and a first static latch circuit (SCU@ in FIG. 5) that is connected to the first node and retains data of the first node.

When applying the embodiment, it is possible to provide a semiconductor memory device capable of improving reliability. Furthermore, embodiments are not limited to the above-described embodiments, and various modifications can be made.

For example, in the third and fourth embodiments, when operating only one of the sense amplifier units SAU connected to the connection circuit LCC, data may be retained to a latch circuit of the other sense amplifier unit SAU. More specifically, for example, in FIG. 20, when not using the sense amplifier unit SAU1, the connection circuit LCC sets the transistor 33 to an on-state, and electrically connects the bus LBUS0 of the sense amplifier unit SAU0 and the bus LBUS1 of the sense amplifier unit SAU1. In addition, in the sense amplifier unit SAU0, for example, data that is required may be stored in any one of the latch circuits ADL, BDL, CDL, and TDL of the sense amplifier unit SAU1. According to this, it is possible to reduce the number of latch circuits which are included in one sense amplifier unit SAU.

In addition, in the above-described embodiments, the node CLKDB may be the bus DBUS.

In addition, application can be made to a three-dimensional stacked NAND-type flash memory or a planar NAND-type flash memory that is different from the above-described embodiments. Furthermore, application can also be made to a semiconductor memory device that uses a memory element capable of retaining data without limitation to the NAND-type flash memory.

In addition, for example, the "connection" in the above-described embodiments also includes an indirect connection state that is established through any member such as a transistor and a resistor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein maybe made without departing from the spirit of the inventions. The accompanying claims and their equivalents are intended to cover such forms or modifications as would fall within the scope and spirit of the inventions.

Furthermore, in the respective embodiments, the following configuration may be employed. For example, when the memory cell transistor MT is capable of retaining two-bit (four-value) data, and when a threshold level during retention of any one of the four values is set as an E-level (erasure level), an A-level, a B-level, and a C-level from a lower side, the following configuration can be employed.

(1) In the read operation, for example, a voltage, which is applied to a word line selected for a read operation of the A-level, is in a range of 0 V to 0.55 V. The voltage may be set to any one of ranges of 0.1 V to 0.24 V, 0.21 V to 0.31 V, 0.31 V to 0.4 V, 0.4 V to 0.5 V, and 0.5 V to 0.55 V without limitation to the voltage range.

For example, a voltage, which is applied to a word line selected for a read operation of the B-level, is in a range of 1.5 V to 2.3 V. The voltage may be set to any one of ranges of 1.65 V to 1.8 V, 1.8 V to 1.95 V, 1.95 V to 2.1 V, and 2.1 V to 2.3 V without limitation to the voltage range.

For example, a voltage, which is applied to a word line selected for a read operation of the C-level, is in a range of 3.0 V to 4.0 V. The voltage may be set to any one of ranges of 3.0 V to 3.2 V, 3.2 V to 3.4 V, 3.4 V to 3.5 V, 3.5 V to 3.6 V, and 3.6 V to 4.0 V without limitation to the voltage range.

For example, read operation time (tR) may be set to a range of 25 µs to 38 µs, 38 µs to 70 µs, or 70 µs to 80 µs.

(2) As described above, the write operation includes the programming operation and the verification operation. In the write operation, for example, a voltage, which is first applied to a word line selected during the programming operation, is in a range of 13.7 V to 14.3 V. For example, the voltage may be set to any one of ranges of 13.7 V to 14.0 V, and 14.0 V to 14.6 V without limitation to the voltage range.

A voltage that is first applied to a selected word line during a write operation to an odd-numbered word line, and a voltage that is first applied to a selected word line during a write operation to an even-numbered word line may be changed.

When setting the programming operation to an incremental step pulse program (ISPP) method, for example, a step-up voltage may be set to approximately 0.5 V.

For example, a voltage, which is applied to a non-selected word line, may be set to a range of 6.0 V to 7.3 V. For example, the voltage may be set to a range of 7.3 V to 8.4 V, or 6.0 V or less without limitation to the voltage range.

A pass voltage, which is applied, may be changed depending on whether or not the non-selected word line is an odd-numbered word line or an even-numbered word line.

For example, write operation time (tProg) may be set to a range of 1700 µs to 1800 µs, 1800 µs to 1900 µs, or 1900 µs to 2000 µs.

(3) In the erasing operation, for example, a voltage that is first applied to a well, which is formed on an upper side of the semiconductor substrate, and on which the memory cell is disposed on an upper side thereof, is in a range of 12 V to 13.6 V. For example, the voltage may be set to a range of 13.6 V to 14.8 V, 14.8 V to 19.0 V, 19.0 V to 19.8 V, or 19.8 V to 21 V without limitation to the voltage range.

For example, erasing operation time (tErase) may be set to a range of 3000 µs to 4000 µs, 4000 µs to 5000 µs, or 4000 µs to 9000 µs.

(4) With regard to the structure of the memory cell, a charge storage layer, which is disposed on the semiconductor substrate (silicon substrate) through a tunnel insulating film having a film thickness of 4 to 10 nm, is provided. The charge storage layer maybe set to have a stacked structure including an insulating film such as SiN and SiON which have a film thickness of 2 to 3 nm, and a polysilicon having a film thickness of 3 to 8 nm. In addition, a metal such as Ru may be added to the polysilicon. In addition, an insulating film is provided on the charge storage layer. For example, the insulating film includes a silicon oxide film having a film thickness of 4 to 10 nm which is interposed between a lower-layer High-k film having a film thickness of 3 to 10 nm and an upper-layer High-k film having a film thickness of 3 to 10 nm. Examples of the High-k film include HfO and the like. In addition, the film thickness of the silicon oxide film may be set to be larger than the film thickness of the High-k film. A control electrode, which has a film thickness of 30 nm to 70 nm, is formed on the insulating film through a work function adjustment material having a film thickness of 3 to 10 nm. Here, examples of the work function adjustment material include a metal oxide film such as TaO, and a metal nitride film such as TaN. W and the like may be used for the control electrode.

In addition, an air gap may be formed between memory cells.

What is claimed is:

1. A semiconductor memory device, comprising:
a memory cell;
a bit line connected to the memory cell; and a sense amplifier connected to the memory cell through the bit line, wherein the sense amplifier includes
a sense node connected to the bit line,
a first capacitive element connected to the sense node, and
a static latch circuit connected to the sense node so that a voltage level at the sense node is digitized and latched in the static latch circuit after a sense operation, and wherein
the static latch circuit includes a first inverter comprising a first PMOS transistor and a first NMOS transistor which are connected in series to each other, and a second inverter comprising a second PMOS transistor and a second NMOS transistor which are connected in series to each other, and
the sense node is connected to an input of the first inverter and an output of the second inverter, and an output of the first inverter is connected to an input of the second inverter, and wherein
a first voltage is applied to a source of the first PMOS transistor and a source of the second PMOS transistor during charging of the sense node, and
a second voltage, which is lower than the first voltage, is applied to the sources of the first and second PMOS transistors during the sense operation.

2. The device according to claim 1, further comprising:
a controller configured to apply a third voltage to a back gate of the first PMOS transistor during charging of the sense node, wherein the third voltage is higher than a voltage of the source of the first PMOS transistor during charging of the sense node and a voltage of a gate of the first PMOS transistor during charging of the sense node.

3. The device according to claim 1,
wherein the sense amplifier further includes a third NMOS transistor that is connected in series between the second PMOS transistor and the second NMOS transistor.

4. The device according to claim 1,
wherein the sense amplifier further includes a dynamic latch circuit that is connected to the sense node.

5. The device according to claim 4, wherein the dynamic latch circuit includes,
a fourth NMOS transistor having a drain connected to the sense node, a source that is grounded, and a gate connected to the input of the second inverter, and
a second capacitive element connected between the gate of the fourth NMOS transistor and ground.

6. The device according to claim 1, wherein
the sense amplifier further includes a third capacitive element connected to the sense node,
electrodes of the first and third capacitive elements on one side are connected to the sense node,
electrodes of the first and third capacitive elements on the other side are connected to first and second nodes, respectively, and
when charges of the bit line are transferred to the sense node, a voltage, which is higher than a ground voltage, is applied to the first and second nodes.

7. The device according to claim 6,
wherein the first capacitive element represents wiring-to-wiring capacitance between the sense node and the first node.

8. The device according to claim 6,
wherein the first capacitive element represents contact-to-plug capacitance between a first contact plug that is connected to the sense node and a second contact plug that is connected to the first node.

9. A semiconductor memory device, comprising:
first and second memory cells;
first and second bit lines connected to the first and second memory cells, respectively;
first and second sense amplifiers connected to the first and second bit lines, respectively; and
a first circuit that connects the first and second sense amplifiers,
wherein the first sense amplifier includes,
a first sense node connected to the first bit line,
a first capacitive element connected to the first sense node, and
a first static latch circuit connected to the first sense node so that a voltage level at the first sense node is digitized and latched in the first static latch circuit after a first sense operation, and
wherein the second sense amplifier includes,
a second sense node connected to the second bit line,
a second capacitive element connected to the second sense node, and
a second static latch circuit connected to the second sense node so that a voltage level at the second sense node is digitized and latched in the second static latch circuit after a second sense operation, and wherein
the first static latch circuit includes a first inverter comprising a first PMOS transistor and a first NMOS transistor which are connected in series to each other, and a second inverter comprising a second PMOS transistor and a second NMOS transistor which are connected in series to each other, and the first sense node is connected to an input of the first inverter and an output of the second inverter, and an output of the first inverter is connected to an input of the second inverter, and
the second static latch circuit includes a third inverter comprising a third PMOS transistor and a third NMOS transistor which are connected in series to each other, and a fourth inverter comprising a fourth PMOS transistor and a fourth NMOS transistor which are connected in series to each other, and the second sense node is connected to an input of the third inverter and an output of the fourth inverter, and an output of the third inverter is connected to an input of the fourth inverter, and wherein
a first voltage is applied to a source of the first PMOS transistor and a source of the second PMOS transistor during charging of the first sense node, and
a second voltage, which is lower than the first voltage, is applied to the sources of the first and second PMOS transistors during the first sense operation.

10. The device according to claim 9, wherein the first circuit includes
a first transistor that connects the input of the second inverter and the input of the fourth inverter,
a second transistor that connects the input of the second inverter and a connection node between the fourth PMOS transistor and the fourth NMOS transistor, and
a third transistor that connects the input of the fourth inverter and a connection node between the second PMOS transistor and the second NMOS transistor.

11. The device according to claim 9,
wherein the first sense amplifier further includes a third capacitive element that is connected to the first sense node,
electrodes of the first and third capacitive elements on one side are connected to the first sense node, electrodes of the first and third capacitive elements on the other side are connected to first and second nodes, respectively, and when charges of the first bit line are transferred to the first sense node, a voltage, which is higher than a ground voltage, is applied to the first and second nodes.

12. The device according to claim 11,
wherein the first capacitive element represents wiring-to-wiring capacitance between the first sense node and the first node.

13. The device according to claim 11,
wherein the first capacitive element represents contact-to-plug capacitance between a first contact plug that is connected to the first sense node and a second contact plug that is connected to the first node.

14. A semiconductor memory device, comprising:
a memory cell;
a bit line connected to the memory cell; and
a sense amplifier connected to the memory cell through the bit line, the sense amplifier including a sense node connected to the bit line, a first capacitive element connected to the sense node, and a latch circuit connected to the sense node so that a voltage level of the sense node is digitized and latched in the latch circuit after a sense operation, wherein the latch circuit includes a first inverter comprising a first PMOS transistor and a first NMOS transistor which are connected in series to each other, and a second inverter comprising a second PMOS transistor and a second NMOS transistor which are connected in series to each other, and the sense node is connected to an input of the first inverter and an output of the second inverter, and an output of the first inverter is connected to an input of the second inverter, and wherein a first voltage is applied to a source of the first PMOS transistor and a source of the second PMOS transistor during charging of the sense node, and a second voltage, which is lower than the first voltage, is applied to the sources of the first and second PMOS transistors during the sense operation.

15. The device according to claim 14, wherein
the sense amplifier further includes a second capacitive element connected to the sense node,
electrodes of the first and second capacitive elements on one side are connected to the sense node,
electrodes of the first and second capacitive elements on the other side are connected to first and second nodes, respectively, and
when charges of the bit line are transferred to the sense node, a voltage, which is higher than a ground voltage, is applied to the first and second nodes.

16. The device according to claim 14,
wherein the first capacitive element is connected between the sense node and a source of the first NMOS transistor.

17. The device according to claim 14,
wherein a source of the first NMOS transistor is connected to a first node, and the first capacitive element is connected between the sense node and a second node.

18. The device according to claim 14, further comprising:
a controller configured to apply a third voltage to a back gate of the first PMOS transistor during charging of the sense node, wherein the third voltage is higher than a voltage of the source of the first PMOS transistor during charging of the sense node and a voltage of a gate of the first PMOS transistor during charging of the sense node.

* * * * *